United States Patent
Bradley et al.

(10) Patent No.: US 12,253,552 B2
(45) Date of Patent: Mar. 18, 2025

(54) APPARATUS FOR DETECTION OF ELECTRICAL DISTURBANCES RESULTING FROM ELECTROMAGNETIC PULSE

(71) Applicants: Arthur Thomas Bradley, Chesapeake, VA (US); Jason R DeVries, Kalamazoo, MI (US)

(72) Inventors: Arthur Thomas Bradley, Chesapeake, VA (US); Jason R DeVries, Kalamazoo, MI (US)

(73) Assignee: Faraday Defense Corporation, Kalamazoo, MI (US)

( * ) Notice: Subject to any disclaimer, the term of this patent is extended or adjusted under 35 U.S.C. 154(b) by 161 days.

(21) Appl. No.: 18/296,358

(22) Filed: Apr. 5, 2023

(65) Prior Publication Data
US 2023/0296657 A1 Sep. 21, 2023

Related U.S. Application Data

(63) Continuation-in-part of application No. 17/649,919, filed on Feb. 3, 2022, now Pat. No. 11,990,746.
(Continued)

(51) Int. Cl.
| | | |
|---|---|---|
| G01R 29/08 | (2006.01) | |
| G21J 5/00 | (2006.01) | |
| H02H 5/00 | (2006.01) | |

(52) U.S. Cl.
CPC ..... *G01R 29/0814* (2013.01); *G01R 29/0878* (2013.01); *G21J 5/00* (2013.01); *H02H 5/005* (2013.01)

(58) Field of Classification Search
CPC .......... H02H 9/045; H02H 9/041; H02H 3/22; H02H 5/005; G01R 31/001
(Continued)

(56) References Cited

U.S. PATENT DOCUMENTS

| | | |
|---|---|---|
| 4,152,743 A | 5/1979 | Comstock |
| 4,271,446 A | 6/1981 | Comstock |
| (Continued) | | |

FOREIGN PATENT DOCUMENTS

| | | |
|---|---|---|
| EP | 0164193 A1 | 12/1985 |
| EP | 0338107 B1 | 4/1988 |
| (Continued) | | |

OTHER PUBLICATIONS

Instruction Sheet Circuit breaker with integrated overvoltage protection, Resi9 Combi SPU 1PN—R91206, by Schneider Electric, May 2021.
(Continued)

*Primary Examiner* — Kevin J Comber
(74) *Attorney, Agent, or Firm* — Patents and Licensing LLC; Daniel W Juffernbruch

(57) ABSTRACT

An apparatus detects an E3 phase and E1 and E2 phases of an electromagnetic pulse (EMP). A pulse detector detects E1 and E2. A sustained level detector connects to a mains utility power supply line to detect E3. A delay timer holds an indication of a detected E1 or E2 for a predetermined time limit of about 10 minutes. A latch holds an indication that an EMP has occurred when an E3 occurs following an E1 or E2 within the predetermined time limit. An alarm indicates an EMP. A mechanical actuator disconnects the mains utility power supply line from utility power when an EMP is so indicated. The mechanical actuator can be mounted to a panel front face of a circuit breaker box in a configuration to push open a switch surface of a circuit breaker switch lever.

25 Claims, 22 Drawing Sheets

Related U.S. Application Data

(60) Provisional application No. 63/251,090, filed on Oct. 1, 2021.

(58) Field of Classification Search
USPC ............... 361/91.6; 324/71, 11; 455/334
See application file for complete search history.

(56) References Cited

U.S. PATENT DOCUMENTS

| | | | |
|---|---|---|---|
| 4,377,832 | A | 3/1983 | Toney |
| 4,553,189 | A | 11/1985 | Pivit |
| 4,584,622 | A | 4/1986 | Crosby |
| 4,616,286 | A | 10/1986 | Breece |
| 4,630,163 | A | 12/1986 | Cooper |
| 4,669,027 | A | 5/1987 | Elsner |
| 4,698,721 | A | 10/1987 | Warren |
| 4,802,055 | A | 1/1989 | Beckerman |
| 4,901,183 | A | 2/1990 | Lee |
| 4,941,063 | A | 7/1990 | McCartney |
| 5,023,746 | A | 6/1991 | Epstein |
| 5,136,455 | A | 8/1992 | Billingsley |
| 5,144,517 | A | 9/1992 | Wieth |
| 5,388,021 | A | 2/1995 | Stahl |
| 5,392,188 | A | 2/1995 | Epstein |
| 5,436,415 | A | 7/1995 | Smith |
| 5,440,441 | A | 8/1995 | Ahuja |
| 5,896,265 | A | 4/1999 | Glaser |
| 5,956,223 | A | 9/1999 | Banting |
| 5,978,198 | A | 11/1999 | Packard |
| 6,226,162 | B1 | 5/2001 | Kladar |
| 6,392,318 | B1 | 5/2002 | Griffis |
| 6,847,514 | B2 | 1/2005 | Ramarge |
| 7,026,558 | B1 | 4/2006 | Andreyo |
| 7,126,068 | B2 | 10/2006 | Fillppenko |
| 7,239,497 | B2 | 7/2007 | Pozzuoli |
| 7,333,316 | B1 | 2/2008 | Norris |
| 8,035,935 | B2 | 10/2011 | Ramirez |
| 8,222,548 | B2 | 7/2012 | Espeut |
| 8,248,740 | B2 | 8/2012 | Birnbach |
| 8,300,378 | B2 | 10/2012 | Birnbach |
| 9,450,410 | B2 | 9/2016 | Moore |
| 9,906,017 | B2 | 2/2018 | Tsovilis |
| 10,447,026 | B2 | 10/2019 | Kostakis |
| 10,530,151 | B2 | 1/2020 | Carty |
| 10,742,025 | B2 | 8/2020 | Carty |
| 10,811,954 | B2 | 10/2020 | Chu |
| 10,856,453 | B2 | 12/2020 | Easton |
| 10,861,642 | B2 | 12/2020 | Aloszko |
| 10,938,204 | B1 | 3/2021 | Carty |
| 11,171,483 | B2 | 11/2021 | Doynov |
| 11,239,654 | B1 | 2/2022 | Bradley |
| 2001/0055186 | A1 | 12/2001 | Wodrich |
| 2007/0121257 | A1 | 5/2007 | Maitra |
| 2007/0145827 | A1 | 6/2007 | Paik |
| 2007/0298724 | A1* | 12/2007 | Sulkowski ............ H04B 17/23 455/67.13 |
| 2010/0127625 | A1 | 5/2010 | Minarczyk |
| 2011/0089929 | A1* | 4/2011 | Jackson ............ G01R 29/0814 324/72 |
| 2012/0019962 | A1* | 1/2012 | Faxvog ............... H02H 7/0455 327/551 |
| 2012/0147509 | A1 | 6/2012 | Mechanic |
| 2012/0194152 | A1 | 8/2012 | Martinelli |
| 2013/0308229 | A1 | 11/2013 | FaxVog |
| 2015/0004847 | A1 | 1/2015 | Namkoong |
| 2016/0072271 | A1 | 3/2016 | Packard |
| 2016/0087431 | A1 | 3/2016 | Krumpholtz |
| 2016/0126738 | A1 | 5/2016 | Moore |
| 2016/0197469 | A1 | 7/2016 | Fuchs |
| 2016/0231367 | A1* | 8/2016 | Cox .................. G01R 29/0814 |
| 2017/0155244 | A1 | 6/2017 | Dickey |
| 2017/0187181 | A1 | 6/2017 | Kashyap |
| 2017/0299642 | A1 | 10/2017 | Ribiere-Tharaud |
| 2018/0136267 | A1 | 5/2018 | Yao |
| 2019/0036326 | A1 | 1/2019 | Anderson |
| 2019/0214814 | A1 | 7/2019 | Carty |
| 2021/0080495 | A1 | 3/2021 | Kajbaf |
| 2022/0268823 | A1 | 8/2022 | Albuisson |

FOREIGN PATENT DOCUMENTS

| | | |
|---|---|---|
| EP | 0393333 A2 | 10/1990 |
| EP | 2244353 A2 | 10/2010 |
| EP | 2488882 A2 | 4/2011 |
| EP | 3449542 B1 | 7/2022 |
| GB | 2046539 A | 11/1980 |
| GB | 2102218 A | 1/1993 |
| WO | WO2011047377 A2 | 4/2011 |
| WO | WO2011047377 A3 | 4/2011 |
| WO | WO2018065120 A2 | 4/2018 |
| WO | WO2019139933 | 7/2019 |

OTHER PUBLICATIONS

MasterPact MTZ—MicroLogic X Control Unit User Guide, by Schneider Electric, 334 pages, Oct. 2021.

Operation Manual Smart—UPS APC, by Schneider Electric, 28 pages, Jan. 2017.

User Guide UPS Network Management Card 2 APC, by Schneider Electric, 111 pages, Feb. 2019.

English translation of WO2018065120 published Apr. 12, 2018.

International Search Report and Written Opinion by the European Patent Office as International Searching Authority in PCT application PCT/US2022/076889 of 24 pages mailed Apr. 3, 2023.

International Search Report and Written Opinion by the European Patent Office as International Searching Authority, 12 pages mailed Oct. 12, 2023 for PCT application PCT/US2023/0065412 internationally filed Apr. 5, 2023.

Draft International Patent Application PCT/US2023/065412 scheduled to publish by WIPO on Oct. 10, 2024, 56 pages with specification, claims, drawings, and search report.

Preliminary Search Report by the European Patent Office as International Searching Authority in PCT application PCT/US2022/076889 of 16 pages mailed Jan. 12, 2023.

* cited by examiner

Latch *251,252,351,352,353*

Mechanical Actuator *160*

Linear Actuator *960*

| Waveform Component | Coupling Method | Couples Info | Typical Duration |
|---|---|---|---|
| E1 | Radiated, Conducted | Couples Directly Into Small-Scale And Large-Scale Electronics | Nanoseconds |
| E2 | Radiated, Conducted | Couples Directly Into Small-Scale And Large-Scale Electronics | Microseconds |
| E3 | Induction, Conducted | Couples Into Large-Scale Infrastructures And Propagates By Conduction To Affect Smaller Systems | Seconds To Hours |

FIG. 26

APPARATUS FOR DETECTION OF ELECTRICAL DISTURBANCES RESULTING FROM ELECTROMAGNETIC PULSE

PRIORITY CLAIMS

This application is a continuation in part and claims priority under 35 U.S.C. § 120 to U.S. non-provisional application Ser. No. 17/649,919, filed on Feb. 3, 2021, which claims priority under 35 U.S.C. §§ 119(e) and 120 to U.S. provisional application No. 63/251,090, filed on Oct. 1, 2021. Such prior application(s) are incorporated herein by reference as if set forth in full herein.

BACKGROUND OF THE INVENTIONS

1. Technical Field

The present inventions relate to the detection of and protection from complex, time-variant conducted and radiated disturbances resulting from an electromagnetic pulse (EMP).

2. Description of the Related Art

Lightning detection devices observe the ambient environment for radiated electromagnetic disturbances with durations on the order of 50-200 microseconds, timing that is indicative of a lightning event.

Another technology that might be considered comparable is that of power line monitors used for purposes of testing incoming power line connections for unwanted conditions such as open ground, reverse polarity, and steady-state high or low voltage levels. However, such devices do not possess the ability to detect very brief conducted electromagnetic disturbances, such as those of the conducted and radiated pulses associated with E1 and E2 phases of an EMP.

While there have been a few complex methods proposed to detect the occurrence of an EMP, they rely on the use of artificial intelligence, sophisticated signal processing, microprocessors and sensitive digital circuitry requiring shielding, or multi-node networking of large infrastructures.

What is needed is a more reliable EMP detection and improved EMP indication and resultant protective action.

What is additionally needed is device that easy to use and understand by common users and not just for scientists, military personnel, and system engineers.

What is also needed is a simpler device that has a lower cost to manufacture and install.

BRIEF DESCRIPTION OF THE DRAWINGS

The present inventions are illustrated by way of example and are not limited by the accompanying figures, in which like references indicate similar elements. Elements in the figures are illustrated for simplicity and clarity and have not necessarily been drawn to scale or complexity.

The details of the preferred embodiments will be more readily understood from the following detailed description when read in conjunction with the accompanying drawings wherein:

FIG. 26 summarizes the three waveform components of an EMP, how they couple, and their typical durations.

DETAILED DESCRIPTION OF THE PREFERRED EMBODIMENTS

The present inventions are used to detect complex, time-variant conducted and radiated disturbances resulting from an EMP or solar storm. The present inventions comprise circuits that continuously monitor input power lines for the purpose of detecting sustained level disturbances associated with E3, having durations of seconds to hours, and circuits that continuously monitor both the input power lines and the ambient environment for the purpose of detecting pulse electromagnetic disturbances associated with E1 and E2, having durations of nanoseconds to microseconds. When a sustained level or pulse disturbance is detected, a visual alarm, audible alarm, and discrete indication signal are generated. The signal alarm indicator can be used to inform a microcontroller or microprocessor of the alarm condition, and to drive a power switching element, such as an electronically-controlled circuit breaker or an automatic transfer switch, for the purpose of automatically disconnecting power or redirecting the flow of power.

Figure 1:
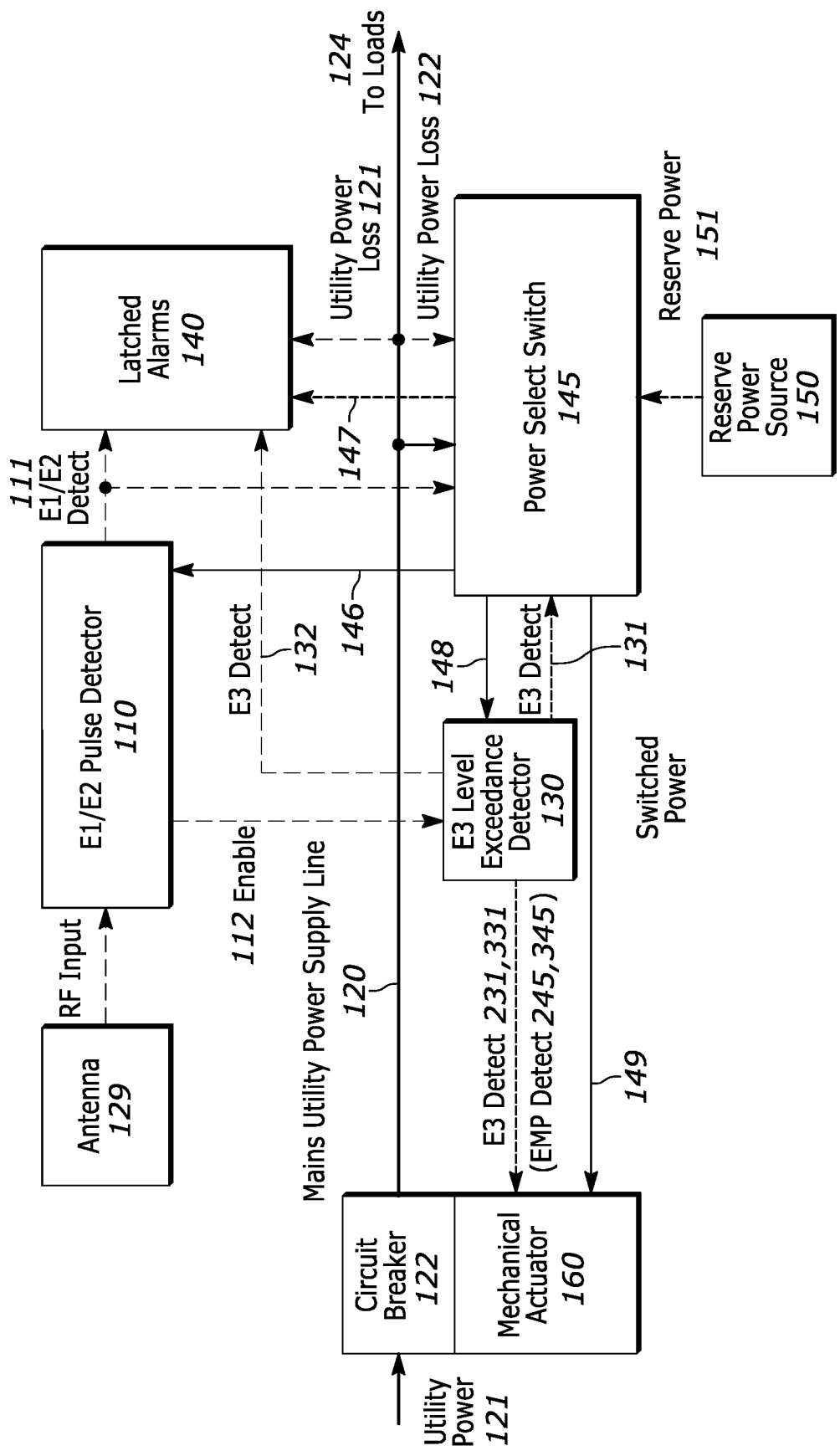
FIG. 1 illustrates a block diagram of a detector of an E3 phase and E1 and E2 phases of an electromagnetic pulse and generate alarms and initiate protection according to embodiments of the present inventions.

FIG. 1 illustrates a block diagram of a detector of an E3 phase and E1 and E2 phases of an electromagnetic pulse that generates alarms and initiates protection according to embodiments of the present inventions. An E3 phase and E1 and E2 phases of an electromagnetic pulse are detected to generate an alarm and optionally take protective measures.

A pulse detector 110 is connected to an input, the pulse detector configured to detect transient electromagnetic pulse disturbances associated with at least one of E1 and E2 phases of an electromagnetic pulse by responding to pulse disturbance durations ranging from nanoseconds to microseconds. The E1/E2 pulse detection signal 111 is passed to the latched alarms 140 for indication, the power select switch 145 for power switching, and to the sustained level detector 130 via the enable line 112 for logical functions. A sustained level detector 130 is connected to the mains utility power supply line, the sustained level detector configured to detect a voltage exceedance associated with an E3 phase of at least one of an electromagnetic pulse and a solar storm. The E3 detection signal 131 is passed to the power select switch 145 for power switching and to the mechanical actuator 160 for actuator activation. The pulse detector 110 can detect pulse disturbance durations in nanoseconds for the E1 phase of an EMP. The pulse detector 110 in an alternate embodiment can detect pulse disturbance durations in microseconds for the E2 phase of an EMP.

A delay timer 340 is connected to the pulse detector for holding an indication of a transient electromagnetic pulse disturbance for a predetermined time limit of minutes. A latch 352 is connected to the sustained level detector and the delay timer to indicate an electromagnetic pulse has occurred when the sustained electrical disturbance occurs following the transient electromagnetic pulse disturbance within the predetermined time limit. An alarm 360 is connected to the latch for alerting when the electromagnetic pulse is indicated by the latch. The delay timer 340 holds an indication of the transient electromagnetic pulse disturbance for a predetermined time limit of about 10 minutes.

A power select switch 145 having an input is connected to the mains utility power supply line 120 and the reserve power source 150 and connected to switch power to the pulse detector 110 via 146, the sustained level detector 130 via 148, the delay timer 340, the latch 352, the latched alarms 140 via 147, and the mechanical actuator 160 via 149 from the mains utility power supply line 120 to the reserve power source 150 when the latch 250, 350 indicates the electromagnetic pulse has occurred when the sustained electrical disturbance has occurred within the predetermined time limit following the transient electromagnetic pulse disturbance.

An antenna 129 is connected to the input of the pulse detector 110 to receive the input signal, the antenna 129 having electrical characteristics, such as length, tuned to a frequency spectrum of the transient electromagnetic pulse disturbances associated with at least one of E1 and E2 phases of an electromagnetic pulse.

The sustained level detector 130 comprises a filter 1705, 1808 connected to the input and having a passband time constant of about 100 milliseconds that removes frequencies associated with the power supply line. The sustained level detector 130 detects when the voltage on the utility power supply line exceeds the nominal value beyond normal variations, which can be indicative of an E3 phase from either a solar event or EMP. An inline filter 1705 is used to remove everyday sinusoidal AC power supply variations and rapid transients from load switching and other power distribution events. This way a rapid transient that would exceed will not be detected as a sustained level.

The input to the pulse detector 110 is connected to the mains utility power supply line 120.

The latch 350 is connected to the sustained level detector 130 and the delay timer to indicate an electromagnetic pulse has occurred when the sustained electrical disturbance occurs within the predetermined time limit following the transient electromagnetic pulse disturbance.

A mechanical actuator 160 is connected to the power select switch 145 to cause disconnection of the mains utility power supply line 120 from utility power 121 when the electromagnetic pulse is indicated by the latch. The mechanical actuator 160 can be a switch or other mechanical actuators to disconnect the mains utility power 120 when the electromagnetic pulse is indicated 245, 345 or when an sustained level exceedance is detected 231, 331, or when utility power is lost 122 as will be described with reference to the alternate embodiments of FIGS. 9-13.

The mechanical actuator 160, 1403 can be secured to a circuit breaker box 1400 to mechanically move a circuit breaker 1401 to disconnect the mains utility power supply 120. The mechanical actuator 160 can be connected to the reserve power source 150 to operate the mechanical actuator 160 using power from the reserve power source 150. An exemplary embodiment of a mechanical actuator 160, 1403 secured to a circuit breaker box will be described with respect to FIG. 14.

The apparatus is built to ensure survival of the apparatus during an electromagnetic pulse and a solar storm. The pulse detector 110, the sustained level detector 130, the delay timer 240, 340, the latch 250, 350, and the latched alarms 140 consists of discrete analog components.

A housing 1411 holds the apparatus including the pulse detector 110, the sustained level detector 130, the delay timer 240, 340, and the latch 250, 350. The housing 1411 has AC mains wall plug prongs 1415 extending from a side of the housing and connected to the mains utility power supply line 120.

Figure 2:
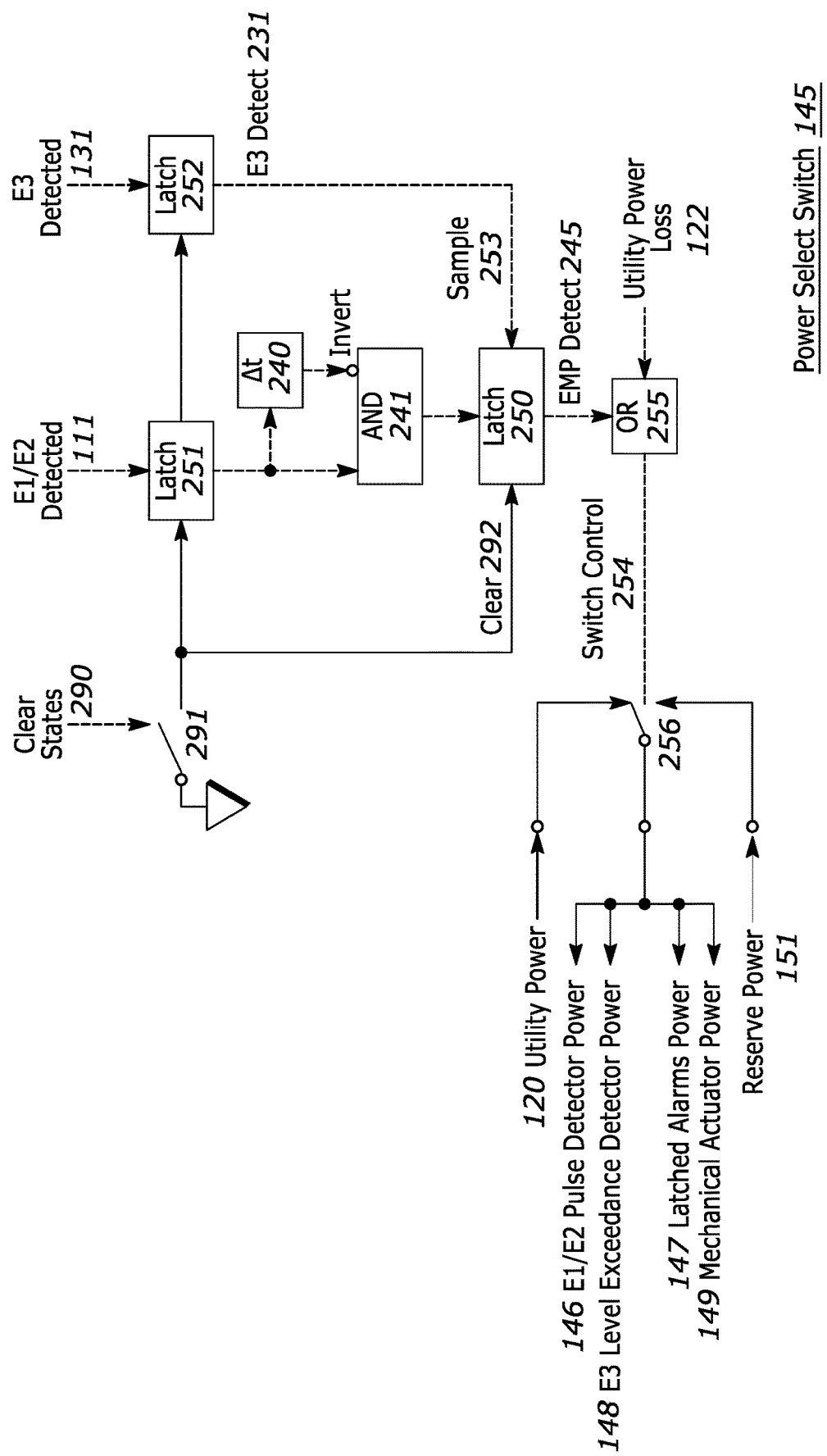
FIG. 2 illustrates details of the analog power select switch in FIG. 1 according to embodiments of the present inventions.

FIG. 2 illustrates details of the analog power select switch in FIG. 1 according to embodiments of the present inventions.

The E1/E2 detection signal 111 is latched in latch 251. The E3 detection signal 131 is latched in latch 252. The output 231 of the E3 latch 252 is used to sample the time delayed E1/E2 signal in latch 250. The output 245 of the latch 250 indicates that an EMP has been detected. The EMP detect signal 245 is logically OR'd with a signal indicating utility power loss 122 and fed via the switch control 254 to the power switch 256. When the utility power is lost or an EMP is detected, the switch 256 switches the power from utility power 120 to reserve power 151. In other embodiments, the EMP detect signal 245, the E3 detect signal 231, or utility power loss signal 122 can be used to drive the switch 256 directly.

A clear signal 290 controls the reset switch 291 that clears the circuit latches.

A delay timer 240 is connected to the pulse detector for holding an indication of a transient electromagnetic pulse disturbance for a predetermined time limit of minutes. A latch 250 is connected to the sustained level detector and the delay timer to indicate an electromagnetic pulse has occurred when the sustained electrical disturbance occurs following the transient electromagnetic pulse disturbance within the predetermined time limit. The delay timer 240 holds an indication of the transient electromagnetic pulse disturbance for a predetermined time limit of about 10 minutes.

A power select switch 145 having an input is connected to the mains utility power supply line 120 and the reserve power source 150 and connected to switch power to circuitry including the pulse detector 110, the sustained level detector 130, the delay timer 240, the latch 252 and 352, the latched alarm 140, and the mechanical actuator 160 from the mains utility power supply line 120 to the reserve power source 150 when the latch 250, 350 indicates the electromagnetic pulse has occurred when the sustained electrical disturbance has occurred within the predetermined time limit following the transient electromagnetic pulse disturbance.

Figure 3:
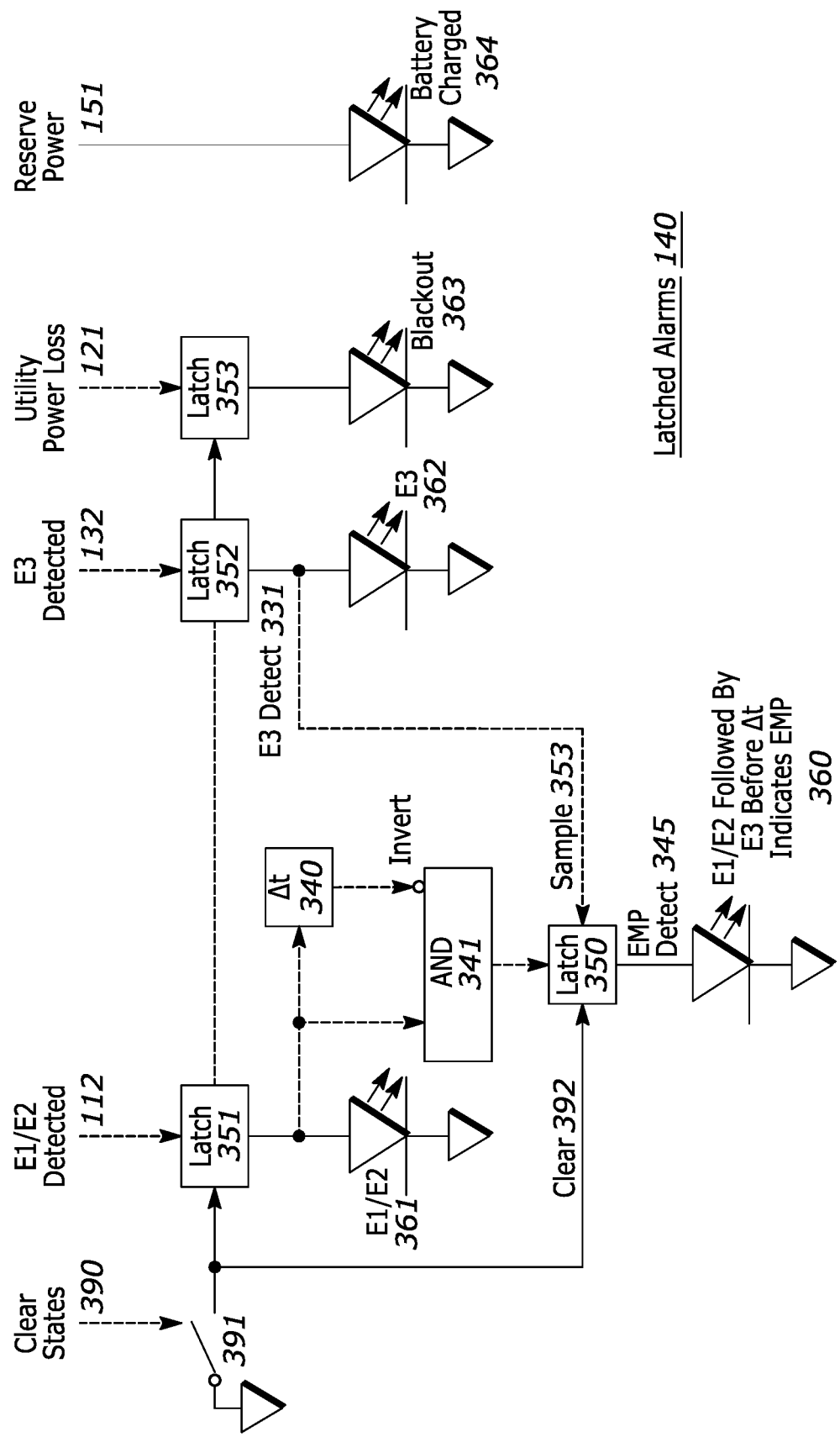
FIG. 3 illustrates details of the analog latched alarms in FIG. 1 according to embodiments of the present inventions.

FIG. 3 illustrates details of the analog latched alarms in FIG. 1 according to embodiments of the present inventions.

A delay timer 340 is connected to the pulse detector for holding an indication of a transient electromagnetic pulse disturbance for a predetermined time limit of minutes. A latch 350 is connected to the sustained level detector and the delay timer to indicate an electromagnetic pulse has occurred when the sustained electrical disturbance occurs following the transient electromagnetic pulse disturbance within the predetermined time limit. An alarm 360 is connected to the latch for alerting when the electromagnetic pulse is indicated by the latch. The delay timer 340 holds an indication of the transient electromagnetic pulse disturbance for a predetermined time limit of about 10 minutes.

The E1/E2 pulse detector detects at least one of E1 and E2. This flexibility is important because while E1 is a reliable indicator of an EMP, it is often difficult to detect with certain circuit embodiments due to its very narrow pulse width. Likewise, E2, while much easier to detect, can be the result of lightning, resulting in erroneous detections in certain circuit embodiments.

The latch 250 and the latch 350 can be one latch or two latches and, likewise, the delay timer 240 and delay timer 340 and other preceding components in the latched alarms 140 and the power select switch 145. Much of the EMP detection logic in the latched alarms 140 and power select switch 150 is identical, allowing shared circuitry to be used. In other embodiments, separate redundant circuitry may be preferred for simplicity of layout, analysis, or testing.

The latched alarms 140 has a first indicator 360 is connected to the latch 350 for alerting when the electromagnetic pulse is indicated by the latch 350, wherein the alarm further comprises a second indicator 361 and a third indicator 362, wherein the second indicator 361 indicates a transient electromagnetic pulse disturbance detected by the pulse detector 110, and the third indicator 362 indicates a sustained electrical disturbance detected by the sustained level detector 130; and wherein the first indicator 360 and the second indicator 361 and the third indicator 362 are each chosen from a visual indicator 2003, 2009, 1421, 1422, 1423, 1424, 1425, an audible indicator 2008, and a discrete indication signal 2007. A fourth indicator 363 indicates loss of utility power 121. A fifth indicator 364 indicates a state of the reserve power 1521, such as a charge status of a battery of the reserve power source 150.

Figure 4:
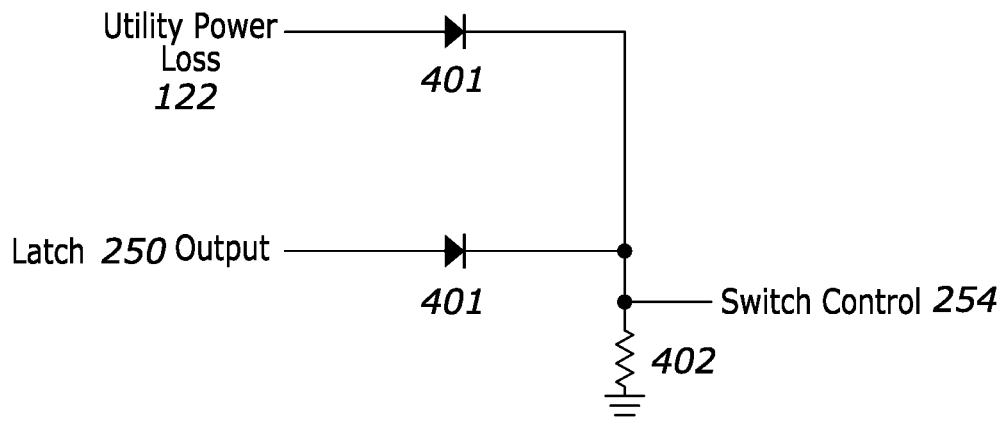
FIG. 4 illustrates details of the analog OR circuit in FIG. 1 according to embodiments of the present inventions.

FIG. 4 illustrates details of the analog OR circuit in FIG. 1 according to embodiments of the present inventions. The analog OR circuit consists of two wired-OR diodes 401 and a pull-down bias resistor 402. When either input signal 122, 245 is high, the output 254, labeled Switch Control, is driven high. When both input signals are low, the output 254 is pulled low by the pull-down resistor 402. In this manner, the output 254 is the logical OR combination of the two inputs 122, 245.

Figure 5:
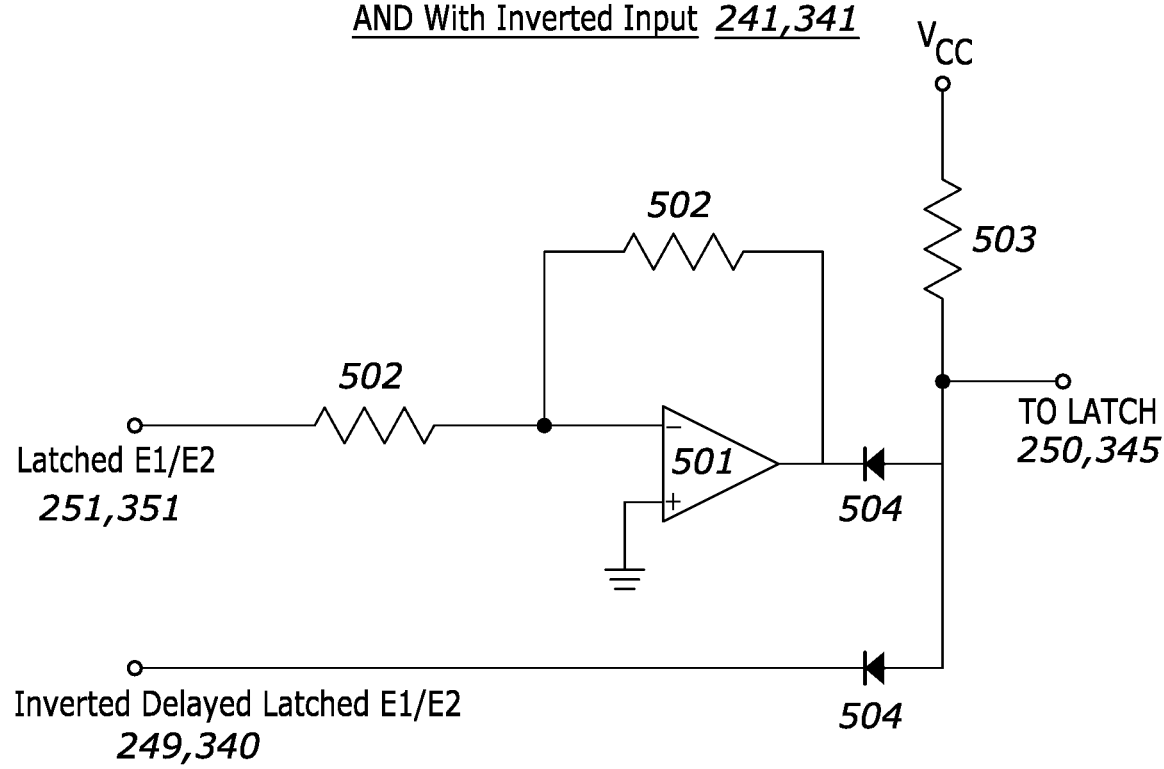
FIG. 5 illustrates details of the analog AND circuit in FIG. 1 according to embodiments of the present inventions.

FIG. 5 illustrates details of the analog AND circuit with one inverted and one non-inverted input in FIG. 1 according to embodiments of the present inventions. The analog AND circuit with an inverted input and a non-inverted input has of an op amp 501, pull-up resistor 503, gain resistors 502, and blocking diodes 504. When input one 251, 351, labeled Latched E1/E2, is high, the output of the op amp is driven low, pulling the circuit output 250, 345, labeled To S/H, low. Likewise, when input two 249, 340, labeled Inverted delayed latched E1/E2, is low, the circuit output 250, 345 is pulled low. When input one 251, 351 is low and input two 249, 340 is high, the blocking diodes 504 are both turned off, allowing for the pull-up resistor 503 to pull the output 250, 345 high. In this manner, the output is the logical AND function of an inverted input and a non-inverted input.

Figure 6:
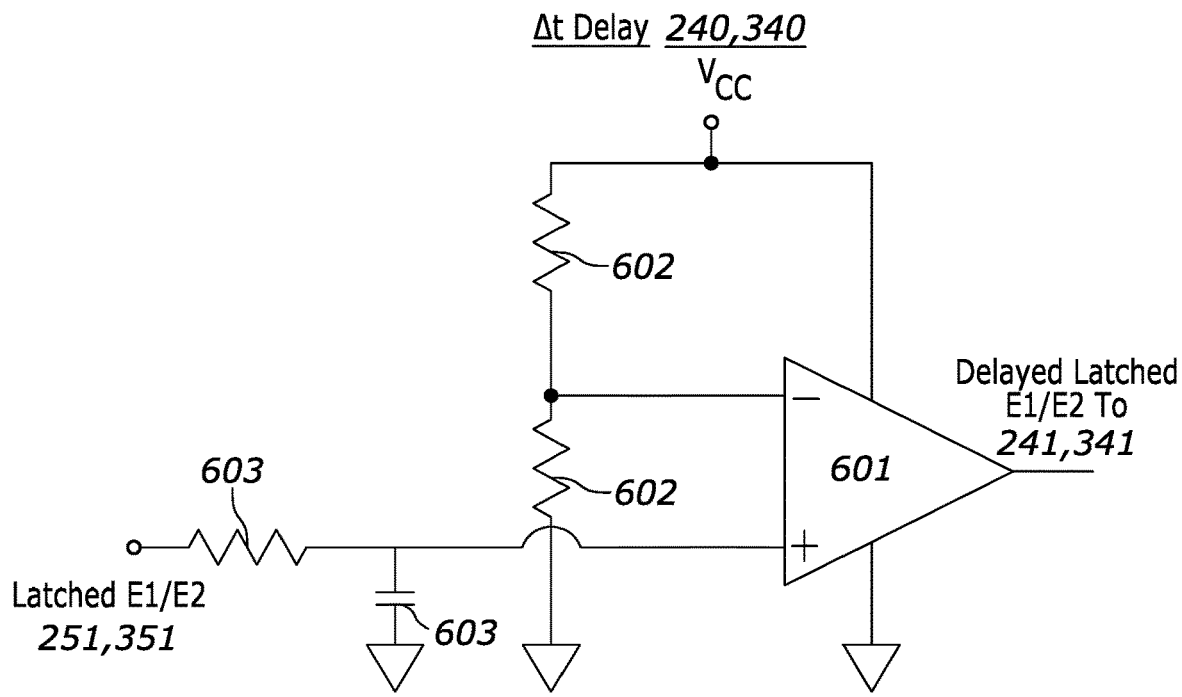
FIG. 6 illustrates details of the analog delay circuit in FIG. 1 according to embodiments of the present inventions.

FIG. 6 illustrates details of the analog delay circuit in FIG. 1 according to embodiments of the present inventions. The analog delay circuit consists of an op amp 601, biasing resistors 602, and a resistor-capacitor low-pass filter 603. The power supply voltage VCC is divided down using the biasing resistors 602, forming a reference voltage on the negative terminal of the op amp. The input pulse or step function 251, 351, labeled Latched E1/E2, is fed through a low-pass filter 603, delaying the signal's rise before it is applied to the op amp's positive input terminal. When the input signal 251, 351 rises above the reference voltage on the op amp's negative input terminal, the output 241, 341, labeled Delayed latched E1/E2, is driven high. In this manner, the output is a delayed version of the input pulse or step function at 251, 351.

Figure 7:
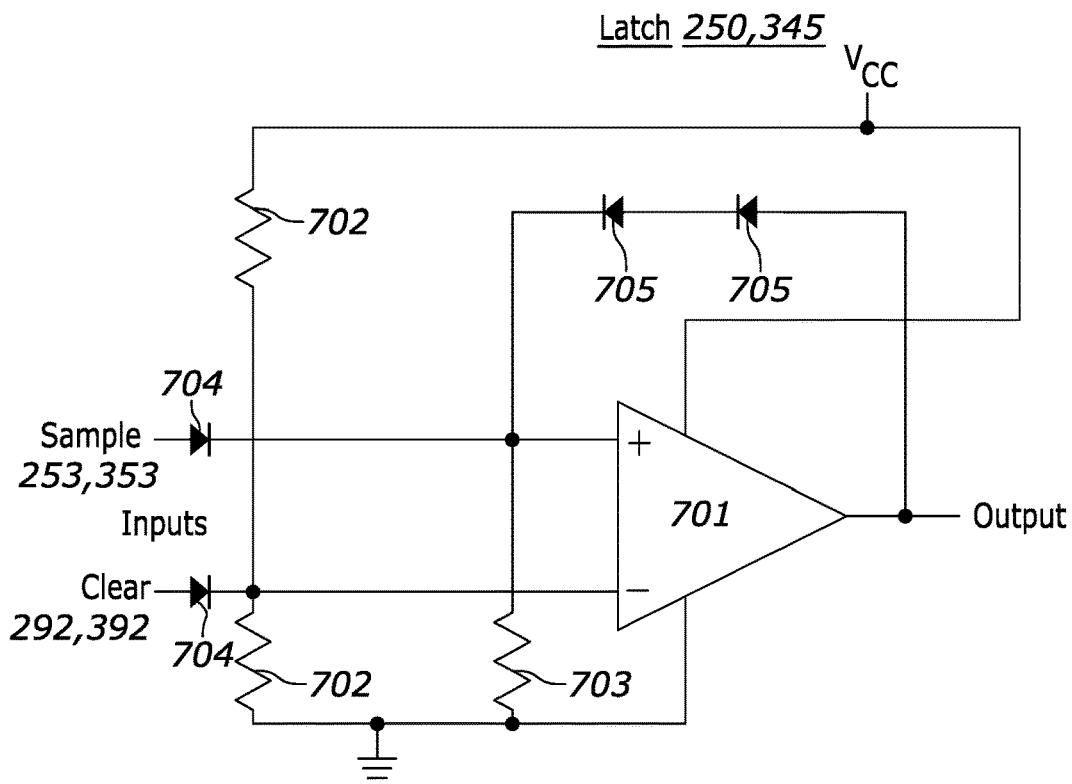
FIG. 7 illustrates details of the analog latch circuit in FIG. 1 according to embodiments of the present inventions.

FIG. 7 illustrates details of the analog latch circuit in FIG. 1 according to embodiments of the present inventions. The analog latch has a Sample input 253, 353 and Clear input 292, 392, an op amp 701, biasing resistors 702, input blocking diodes 704, pull-down resistor 703, and feedback diodes 705. The power supply voltage VCC is divided down using biasing resistors 702 to create a reference voltage at the negative input terminal of the op amp 701 when the Clear input signal is not present. Likewise, the pull-down resistor 703 biases the negative input terminal of the op amp 701 to ground when a Sample signal 253, 353 is not present. When the Clear input signal 292, 392 exceeds the Sample input signal 253, 353, the output of the op amp 701 is driven to the negative supply voltage, which is ground in this case. When the Clear signal 292, 392 falls below the Sample input signal 253, 353, the output of the op amp 701 is driven to the positive supply voltage, VCC in this case. The circuit's resistors 704 and 703 guarantee that when no inputs are applied, the positive input terminal of the op amp 701 will be higher than the negative input terminal, resulting in the output being driven to the positive supply voltage. The feedback diodes 705 allow for positive feedback for rapid stable switching.

Figure 8:
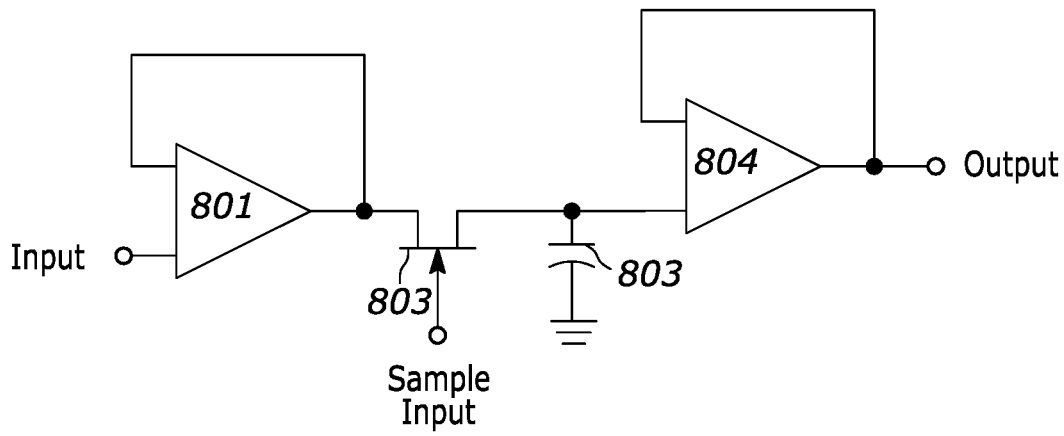
FIG. 8 illustrates details of the analog sample and hold circuit in FIG. 1 according to embodiments of the present inventions.

FIG. 8 illustrates details of the analog sample and hold circuit in FIG. 1 according to embodiments of the present inventions. The sample and hold circuit consists of two op amps 801, 802, a storage capacitor 803, and a switching transistor 802. The input signal is first passed through an op amp 801 configured as unity gain buffer, i.e., an amplifier with a gain of one. When the sample input signal is driven high, the switching transistor 802 turns on, allowing the input op amp 801 to charge the storage capacitor 803 to the input voltage. When the sample input signal is driven low, the switching transistor 802 turns off, and the charge is stored on the storage capacitor 803. The voltage associated with that stored charge is present at the input of a second op amp 804, also configured as a unity gain buffer. The output of the second op amp 804 equals the stored input signal. Since the current into the second op amp is extremely low, the charge stored on the capacitor is not depleted.

Figure 9:
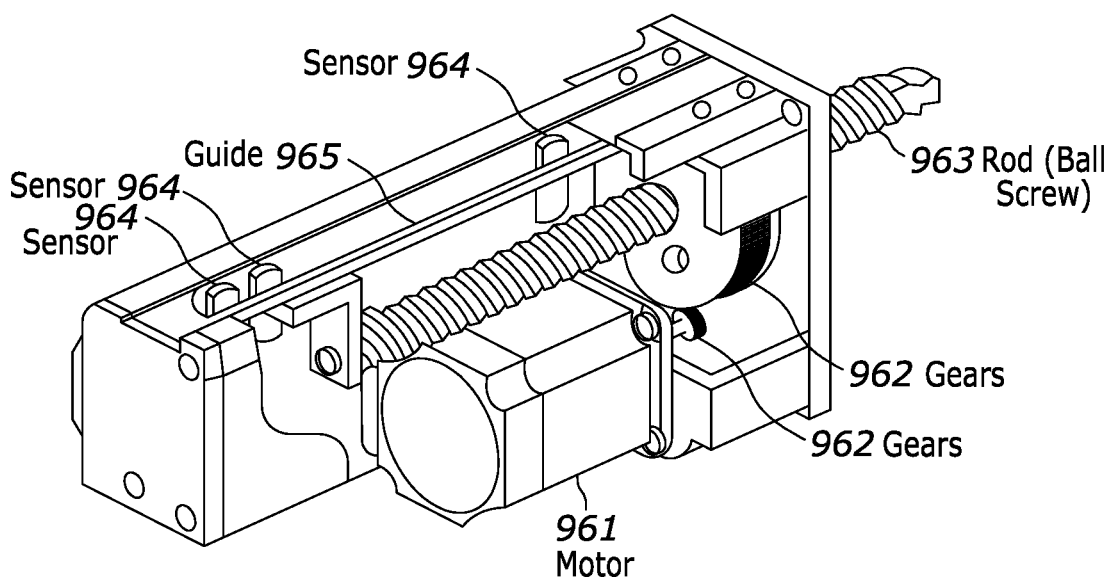
FIG. 9 illustrates details of the mechanical actuator in FIG. 1 according to a linear actuator embodiment of the present inventions.

FIG. 9 illustrates details of actuator in FIG. 1 according to a linear actuator embodiment of the present inventions. The electromechanically activated mechanism is a linear actuator 960. The linear actuator 960 has a motor 961, gears 962, rod 963, sensors 964, and guide 965. When voltage is applied, the motor 961 turns the gears 962, driving the rod 963 in or out along the guide 965, with the direction dependent on the polarity of the voltage. Sensors 964 are used to determine when the rod 963 has moved to its minimum and maximum allowed position, preventing over or under extension.

Figure 10:
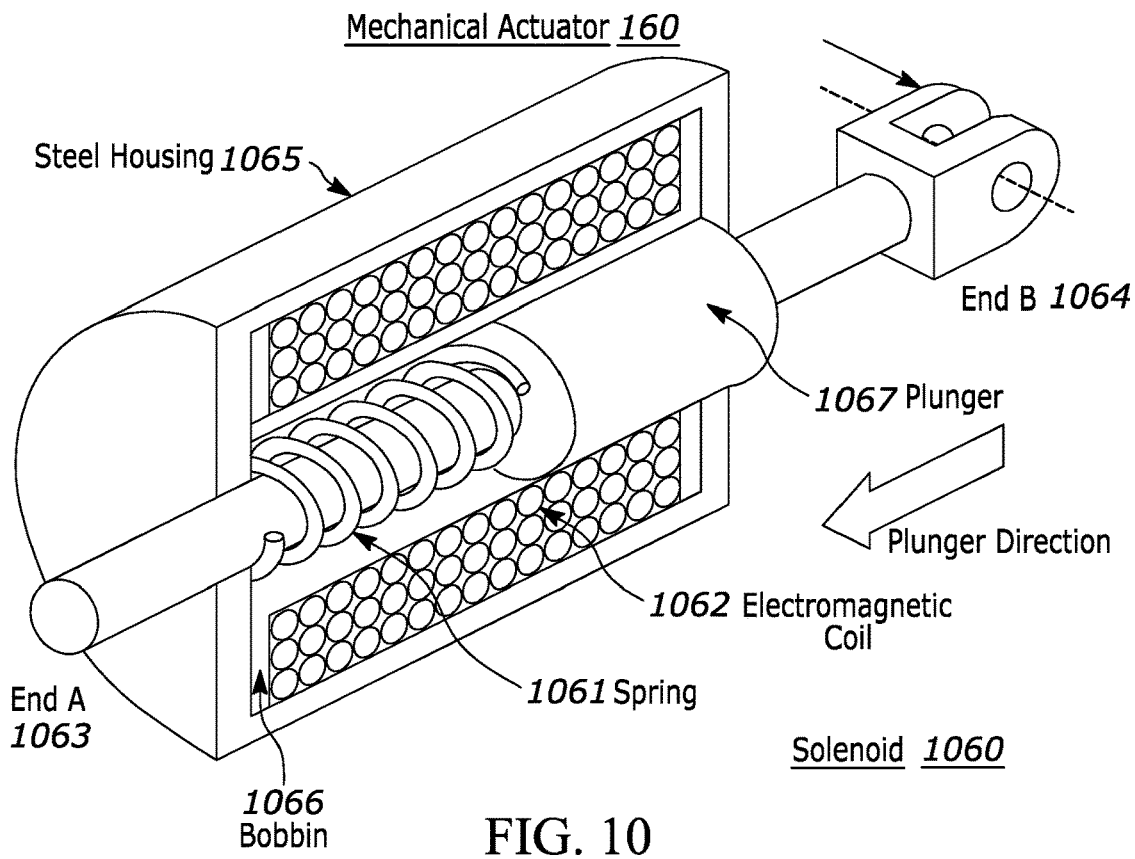
FIG. 10 illustrates details of the mechanical actuator in FIG. 1 according to a solenoid embodiment of the present inventions.

FIG. 10 illustrates details of actuator in FIG. 1 according to a solenoid embodiment of the present inventions. The electromechanically activated mechanism is a solenoid 160 and spring 1061 configured to release the solenoid. The solenoid 1060 has a housing 1065, plunger 1067, return spring 1061, bobbin 1066, electromagnetic coil 1062, and a rod with End A 1063 and End B 1064. When current flows through the electromagnetic coil 1062, End A 1063 is driven outward, and End B 1064 driven inward by the resulting electromagnetic force. The return spring 1061 subsequently compresses, and the plunger 1067 and bobbin 1066 keeps the rod captured. End A 1063 or End B 1064 is attached to a mechanical mechanism that trips the breaker. When current is discontinued through the electromagnetic coil 1062, the electromagnetic force dissipates, and the return spring 1061 pulls the rod back to its initial state, resetting the actuator.

Figure 11:
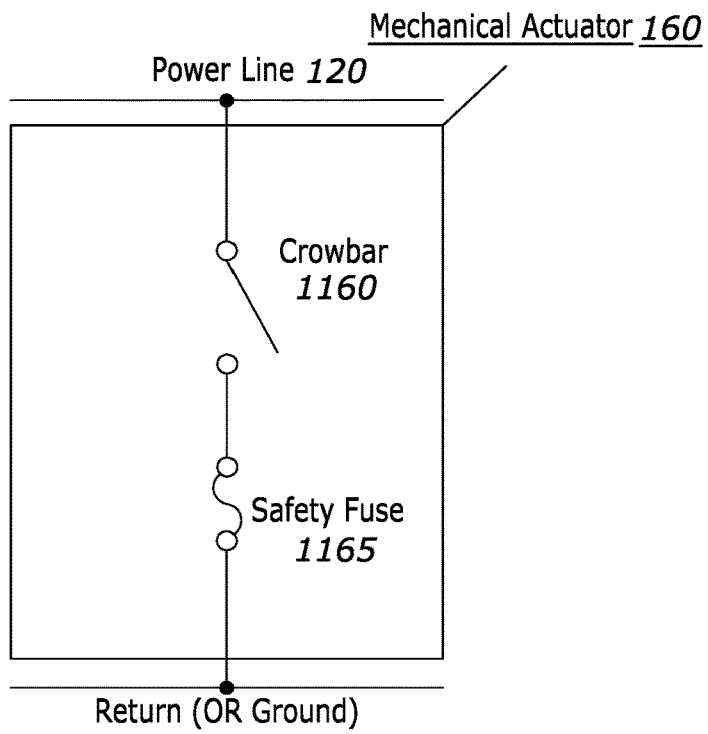
FIG. 11 illustrates details of the mechanical actuator in FIG. 1 according to a crowbar embodiment of the present inventions.

FIG. 11 illustrates details of actuator in FIG. 1 according to a crowbar embodiment of the present inventions. The mechanical actuator 160 has a crowbar circuit 1160 connected across the mains utility power supply line 120 after a circuit breaker 122 to trip and open the circuit breaker 122 and interrupt the mains utility power supply 120. The crowbar 1060 is used to intentionally short the power line to the return or ground line. This introduces a very high surge current flowing from the power line to the return or ground line. The surge current passes through the upstream circuit breaker, causing it to trip or disconnect. A safety fuse 1165 is included in series with the crowbar 1160 to prevent a fire hazard in case the upstream breaker should malfunction or be unable to successfully disconnect. A crowbar implementation is described in U.S. Pat. No. 11,239,654 granted on Feb. 1, 2022 by Arthur Thomas Bradley and is incorporated by reference herein.

Figure 12:
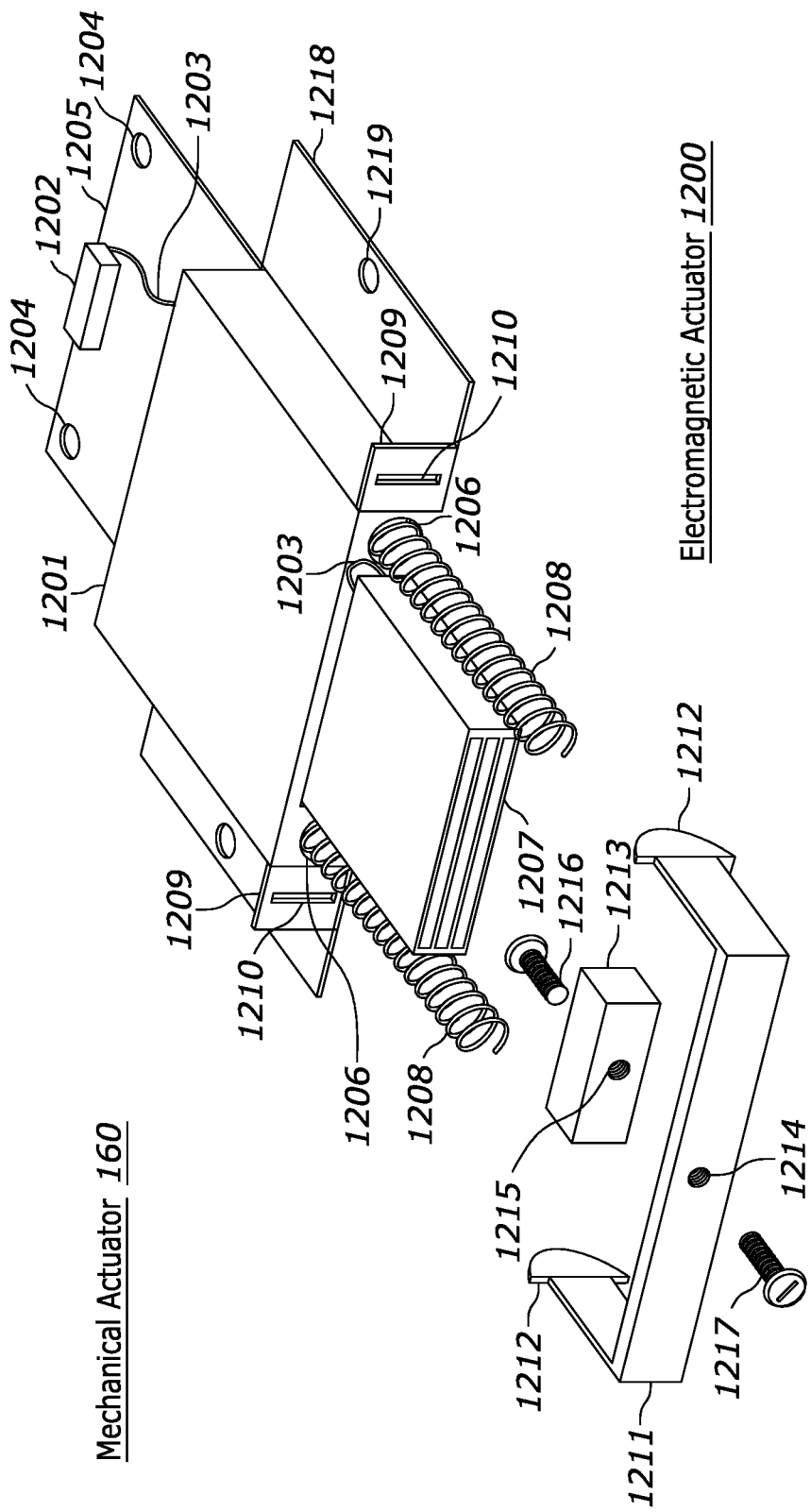
FIG. 12 illustrates an isometric view of the mechanical actuator in FIG. 1 according to a first electromagnetic actuator embodiment of the present inventions.

FIG. 12 illustrates an isometric view of the actuator in FIG. 1 according to a first electromagnetic actuator embodiment of the present inventions. The electromagnet 1207 is contained inside the recess of a housing 1201. The housing 1201 has side and rear mounting plates 1218 and 1205. Each mounting plate has mounting holes 1219 and 1204. Additionally, the housing 1201 has two side flanges 1209 with side flange slots 1210. An electrical connector 1202 is attached to the rear mounting plate 1205. An electrical cable 1203 is attached to the connector and electromagnet 1207. Two springs 1208 are inset into indents 1206 in the side flanges 1209. A spring-activated bracket 1212 is inserted into the side flange slots 1210. On the inside of the spring-activated bracket 1212 is a ferrous block 1213 with a threaded hole 1215. A captured bolt 1216 and 1217 is inserted through the ferrous block 1213 and spring-activated bracket 1212. When power is applied through connector 1202 to the electromagnet 1207, the spring-activated bracket 1212 and ferrous block 1213 are held flush with the electromagnet via electromagnetism. When the electrical power is discontinued, the electromagnet releases the spring-activated bracket 1212 and ferrous block 1213, allowing the springs 1208 to extend them away from the electromagnet 1207. This action can be used to physically move a breaker or other power disconnect that is placed adjacent to the spring-activated bracket 1212. When power is reapplied, the spring-activated bracket 1212 and ferrous block 1213 can be compressed back up against the electromagnet, once again to be held in place by electromagnetism.

Figure 13:
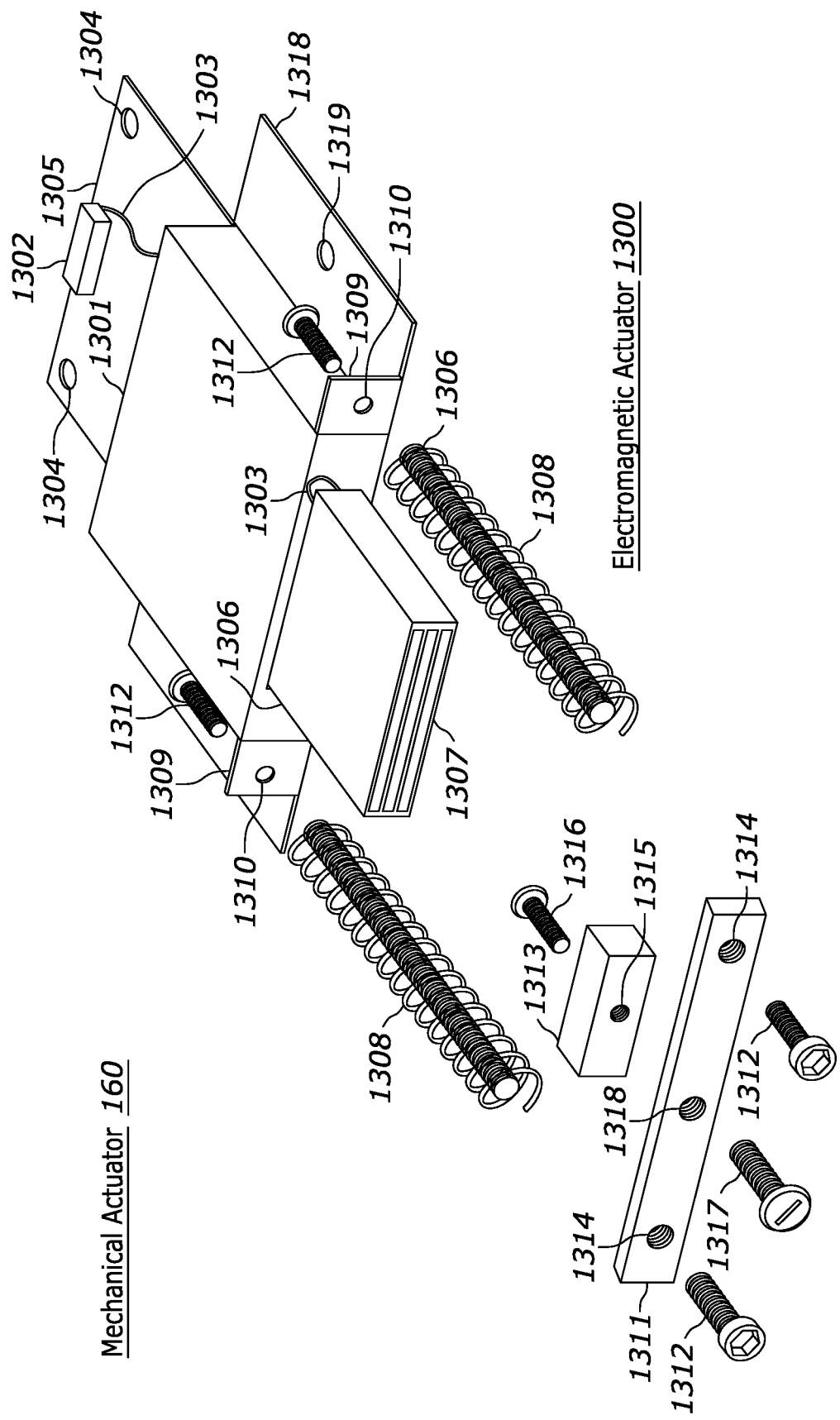
FIG. 13 illustrates an isometric view of the mechanical actuator in FIG. 1 according to a second electromagnetic actuator embodiment of the present inventions.
Figure 14:
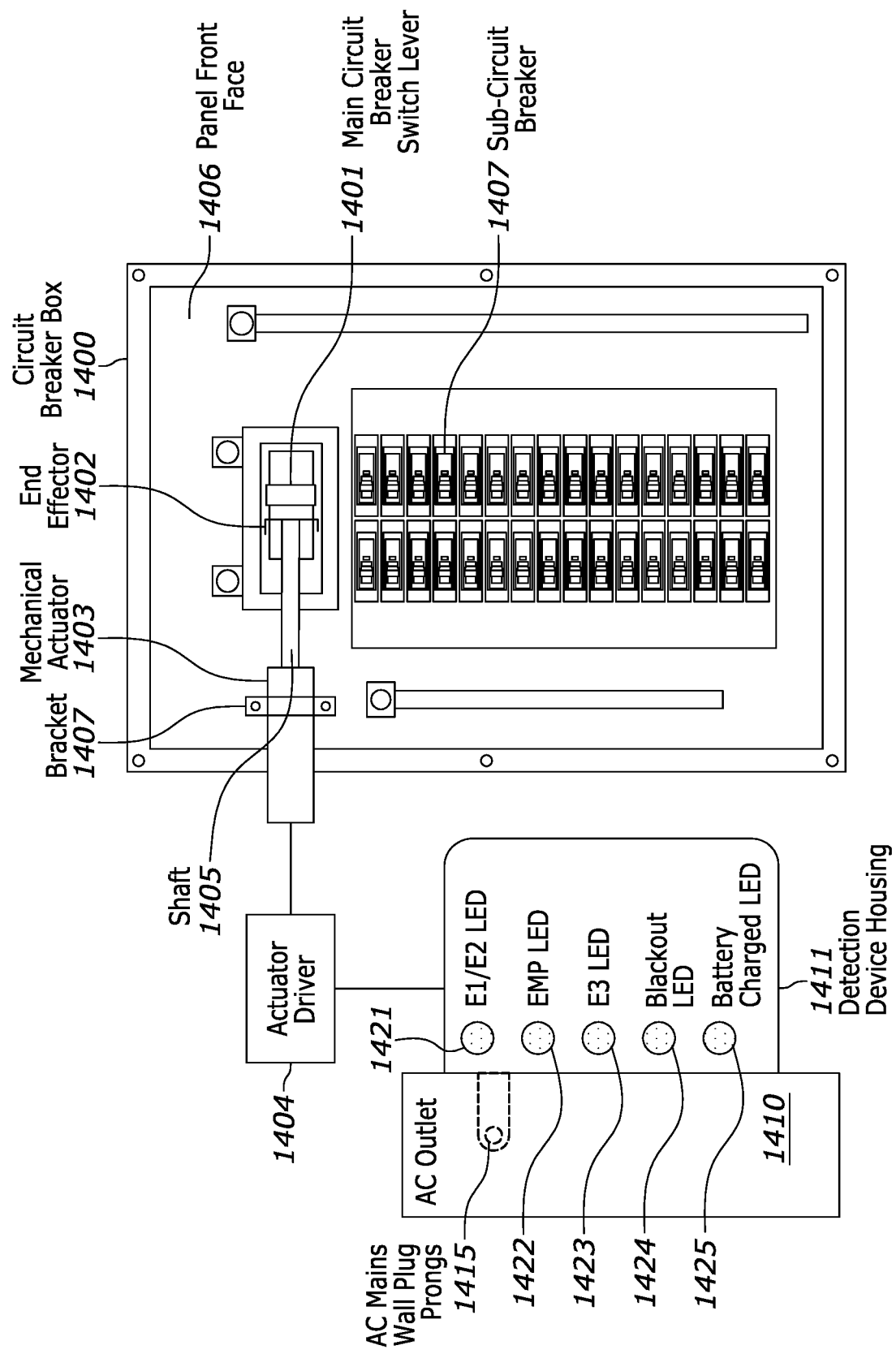
FIG. 14 illustrates a mechanical actuator deployed on the front of a breaker box panel and the detector with alarms according to embodiments of the present inventions.

FIG. 13 illustrates an isometric view of the actuator in FIG. 1 according to a second electromagnetic actuator embodiment of the present inventions. The electromagnet 1307 is contained inside the recess of a housing 1301. The housing 1301 has side and rear mounting plates 1318 and 1305. Each mounting plate has mounting holes 1319 and 1304. Additionally, the housing 1301 has two side flanges 1309 with side flange slots 1310. An electrical connector 1302 is attached to the rear mounting plate 1305. An electrical cable 1303 is attached to the connector and electromagnet 1307. Two springs 1308 and guide rods 1306 are inset into the side flange holes 1310. A spring-activated bracket 1311 is attached to the guide rods 1306 using bolts 1312. On the inside of the spring-activated bracket 1311 is a ferrous block 1313 with a threaded hole 1315. A captured bolt 1316 and 1317 is inserted through the ferrous block 1313 and spring-activated bracket 1311. When power is applied through connector 1302 to the electromagnet 1307, the spring-activated bracket 1311 and ferrous block 1313 are held flush with the electromagnet via electromagnetism. When the electrical power is discontinued, the electromagnet releases the spring-activated bracket 1311 and ferrous block 1313, allowing the springs 1308 to extend them away from the electromagnet 1307. This action can be used to physically move a breaker or other power disconnect that is placed adjacent to the spring-activated bracket 1311. When power is reapplied, the spring-activated bracket 1311 and ferrous block 1313 can be compressed back up against the electromagnet, once again to be held in place by electromagnetism, FIG. 14 illustrates an actuator 1403 deployed on the front of a breaker box panel 1400 and the detector with alarms according to embodiments of the present inventions. The detector 1411 contains detection and alarm circuitry. Alarms include the E1/E2 alarm 1421, EMP alarm 1422, E3 alarm 1423, Blackout 1424, and Battery Charged 1425. The device outputs a control signal to the actuator driver 1404, which drives the actuator 1403 to mechanically trip the breaker 1401 using an end effector 1402. The actuator is mounted by an attachment 1407 to the face 1406 of the breaker panel 1400.

A housing 1411 encases the pulse detector 110, the sustained level detector 130, the delay timer 340, and the latch 350 is contained in a housing 1411. The a housing 1411 in the embodiment illustrated has a pair of conventional AC mains wall plug prongs 1415 extending from a side of the housing for plugging into a conventional AC outlet 1410 to connect to the mains utility power supply line 120 to the mains utility power supply line 120 from the utility power 121. While the pair of conventional AC mains wall plug prongs 1415 is more convenient to install, an alternative direct wire embodiment can also be implemented. The housing 1411 is unshielded in one embodiment to reduce cost and because it encases only analog circuitry not sensitive to EMP damage. In an alternative embodiment, the housing 1411 may be layered with a conductive shielding material to reduce the radiated energy coupling into the circuits to increase confidence the analog circuitry will not be EMP damaged or in case more sensitive circuits are chosen.

The mechanical actuator 160, 1403 is secured to a circuit breaker box 1400 to mechanically move a circuit breaker 1401 to disconnect the mains utility power supply 120.

The mechanical actuator 160, 1403 is an electromechanically activated mechanism securely mounted to a panel front face 1406 of a circuit breaker box 1400 with an end effector 1402 in a configuration to push open a switch surface of a circuit breaker switch lever 1401.

The alarm has a second indicator 361 and a third indicator 362, wherein the second indicator 361 indicates a transient electromagnetic pulse disturbance detected by the pulse detector 110, and the third indicator 362 indicates a sustained electrical disturbance detected by the sustained level detector 130; and wherein the first indicator 360 and the second indicator 361 and the third indicator 362 are each chosen from the group consisting of a visual indicator 2003, 2009, 1421, 1422, 1423, 1424, 1425, an audible indicator 2009, and a discrete indication signal 2007.

The present invention has many advantages. A simple device can be easily mounted on a circuit breaker panel without an electrician. The device can also be plugged into an AC outlet rather than being direct wired. The indicators are easy to use and understand by common users and not just scientists, military personnel, and system engineers. In particular, a reliable indication of an EMP detection is held for a user to confidently know what has caused an interaction or alarm.

Figure 15:
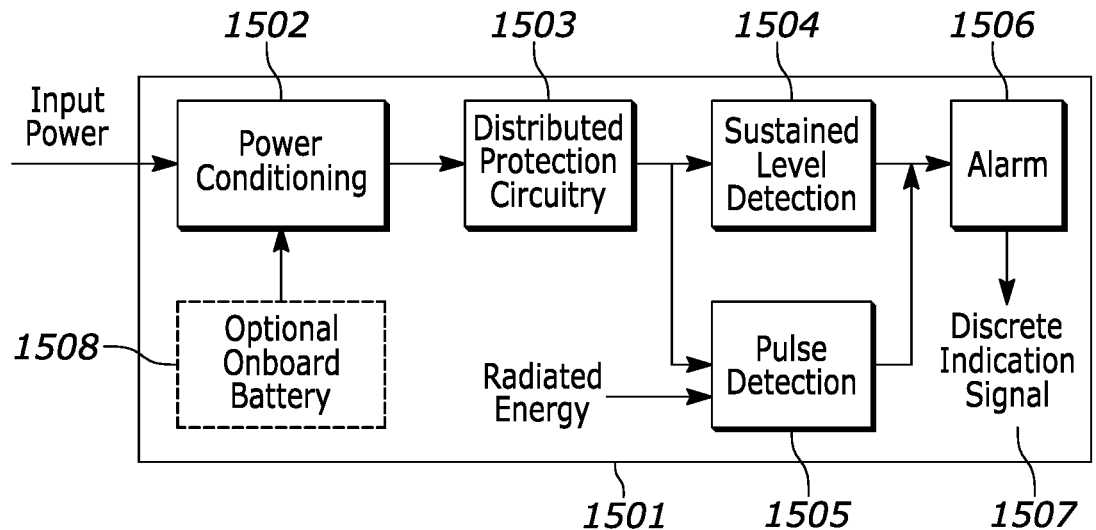
FIG. 15 illustrates a block diagram showing an enclosure, power conditioning circuit, distributed protection circuitry, sustained level detection circuit, pulse detection circuit, alarm circuit, power disconnect switch circuit, and optional onboard battery according to embodiments of the present inventions.

FIG. 15 illustrates a high-level block diagram of the apparatus containing the present inventions. Enclosure 1501 may be shielded with a conductive barrier to suppress out-of-band electromagnetic energy that might cause a false alarm. The power conditioning circuit 1502 converts incoming electrical power to electrical power with characteristics more readily used by the apparatus's electronics. Such power conditioning might not be necessary in the case where input power was already directly usable by the apparatus's circuitry. Protection circuitry 1503 is distributed throughout, enabling it to better survive extreme electrical and electromagnetic transients, such as those resulting from an EMP or solar storm. Protection circuitry could consist of transient voltage suppressors, metal oxide varistors, gas discharge tubes, and other transient surge protection devices. The sustained level detection circuit 1504 monitors the input power line for voltage disturbances associated with the E3 phase, having durations of seconds to hours. Likewise, the pulse detection circuit 1505 monitors the input power line and the ambient radiated environment for transient electromagnetic pulse disturbances associated with the E1 and E2 phases, having durations from nanoseconds to microseconds. Both the sustained detection circuit 1504 and pulse detection circuit 1505 provide signals to the alarm circuit 1506, indicating the detection of a disturbance associated with an EMP or solar storm. The alarm circuit 1506 in turn activates a visual indicator, an audible indicator, and a discrete indication signal 1507 that can be used to inform an external processing element of the detection, as well as trigger the disconnect or rerouting of the flow of electrical power. An onboard battery 1508 would be required in portable embodiments to provide power to the circuit elements.

Figure 16:
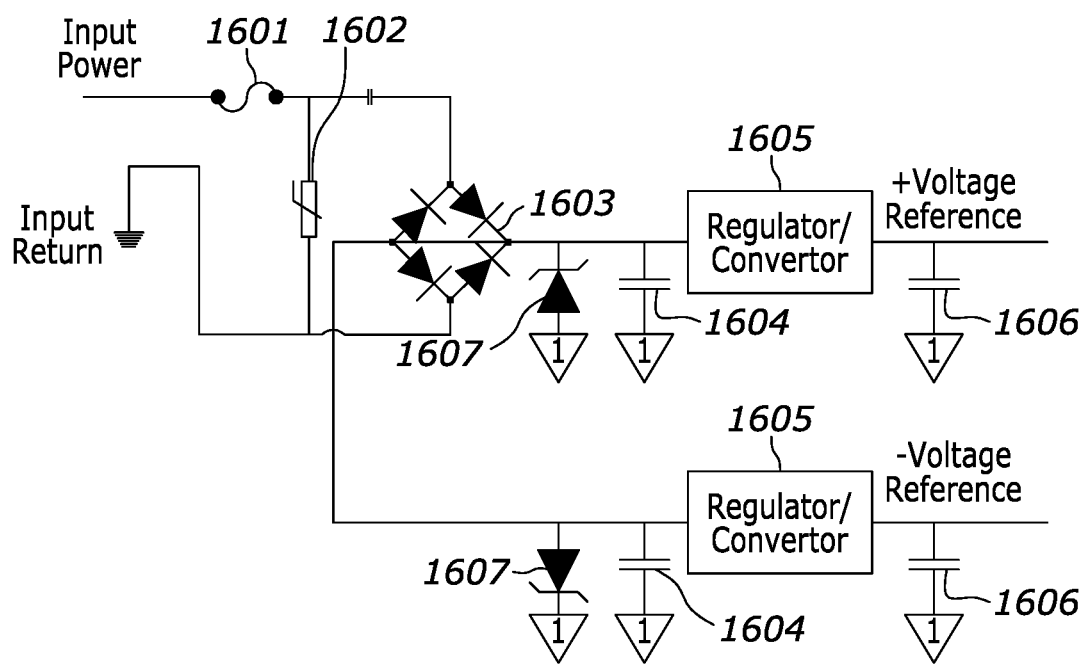
FIG. 16 illustrates a simplified schematic diagram showing the power conditioning circuit; this particular embodiment comprises a fuse, protective varistor, series capacitor, bridge rectifier, zener diodes, and linear regulators or switched converters according to embodiments of the present inventions.

FIG. 16 illustrates a simplified schematic of the power conditioning circuit 1503. The power conditioning circuit converts incoming electrical power to electrical power with characteristics more readily used by the apparatus's electronics. The input power line may be fused 1601 for safety and circuit protection. Additionally, a metal-oxide varistor (MOV) or other transient protection device 1602 can be used to limit the incoming voltage disturbance that might result from an EMP or solar storm. A bridge rectifier 1603 is tapped from both sides to feed nodes that are voltage limited by zener diodes 1607 and ripple limited by capacitors 1604. Power is then fed to linear regulators, dc-dc converters, or other power conversion devices 1605 to provide the voltages, currents, and performance characteristics required by the specific embodiment of the apparatus. Capacitors 1606 are used at the output of the power converters to ensure stability and ripple performance.

Figure 17:
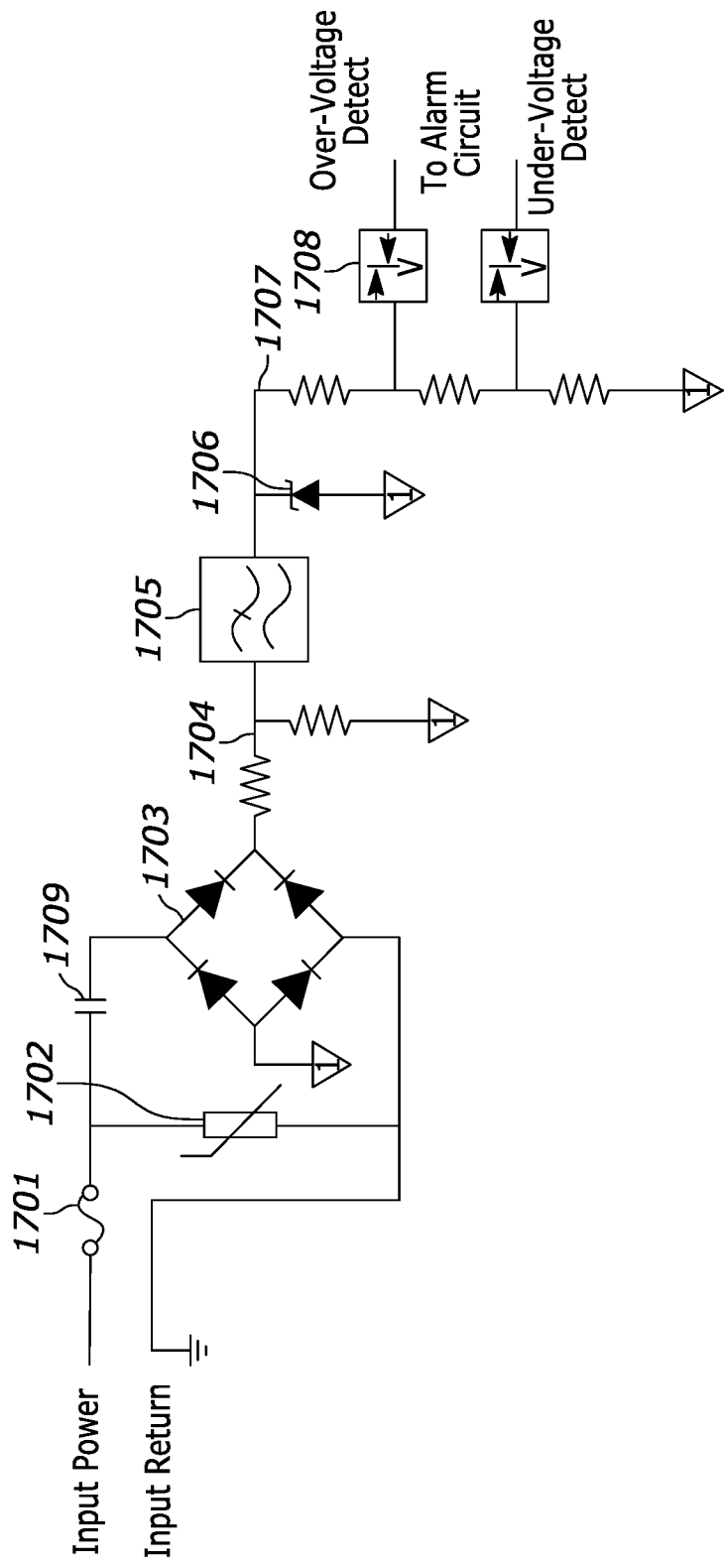
FIG. 17 illustrates a simplified schematic diagram of the sustained level detection circuit; this particular embodiment comprises a fuse, protective varistor, bridge rectifier, voltage divider, low-pass filter, transient voltage suppressor diode, comparator input voltage divider, and window comparator according to embodiments of the present inventions.

FIG. 17 illustrates a simplified schematic of the sustained level detector 1504, which monitors the input power line for voltage disturbances associated with the E3 phase. The sustained level detector detects sustained electrical disturbances associated with an E3 phase of at least one of an electromagnetic pulse and a solar storm. The sustained level detector identifies disturbance durations ranging from seconds to hours. The input may be fused 1701 and protected from severe overvoltage conditions by transient protection device 1702. The input power line also features a series current-limiting capacitor 1709. A bridge rectifier 1703 is used along with a voltage divider 1704 to rectify and scale the incoming voltage level. A low-pass filter 1705 passes durations ranging from seconds to hours by turning the level into a quasi-dc representation, which is limited in magnitude by the zener diode 1706. A minimum end of the seconds to hours range could be chosen at about 60 milliseconds to about 100 milliseconds because one period of a 60 Hz waveform is 16.6 milliseconds or for 50 Hz is 20 milliseconds. Five periods is considered enough to get a reasonable average of the signal, but other average durations also work. A resistor network 1707 is used to create inputs to the over-voltage and under-voltage comparators 1708. The resistors can either be fixed, or variable (i.e., potentiometers) to allow dynamically adjusting the over-voltage and under-voltage trip points. The comparators either have threshold values determined by supporting components or can be window comparators with predefined upper and lower trigger thresholds. The outputs of the comparators feed directly to the alarm circuit.

Figure 18:
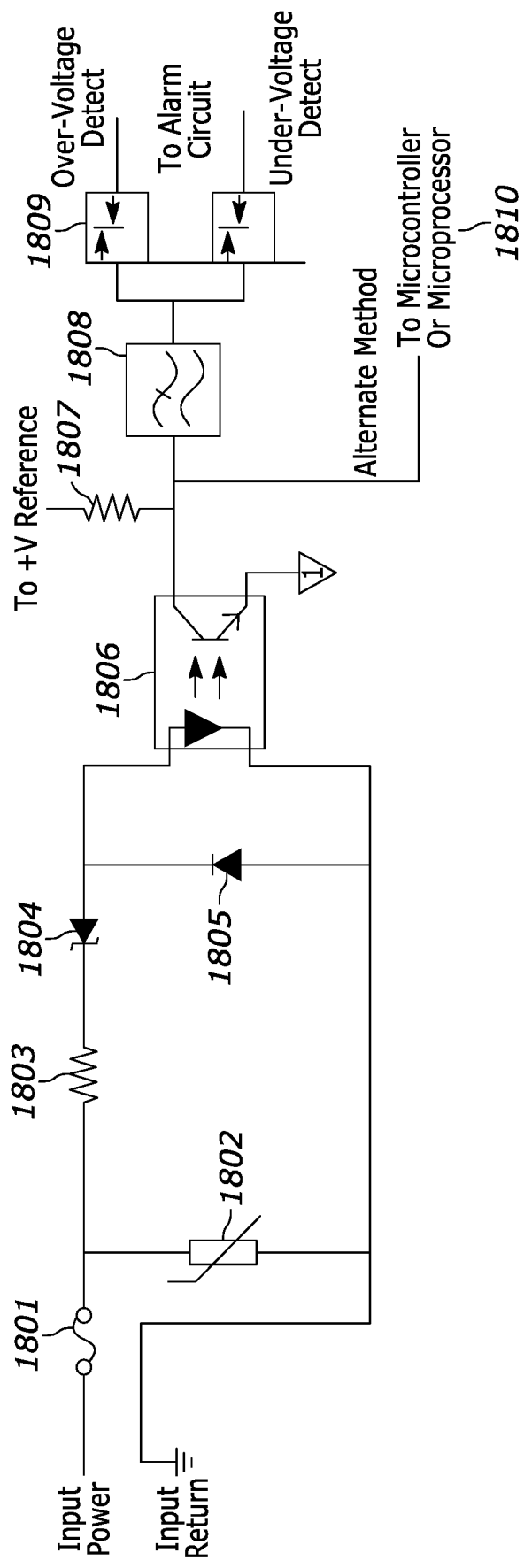
FIG. 18 illustrates a simplified schematic diagram of an alternate embodiment of a sustained disturbance detection circuit; this particular embodiment comprises a fuse, protective varistor, current limiting resistor, sustained level threshold setting zener diode, reverse protective diode, optocoupler, bias resistor, low-pass filter, and window comparator according to embodiments of the present inventions.

FIG. 18 illustrates an alternate embodiment of the sustained disturbance detection circuit 1504. The input power may be fused 1801 and protected from severe overvoltage conditions by transient protection device 1802. A resistor 1803 limits the current flowing into the optocoupler 1806 and can be placed before or after the zener diode 1804. Zener diode 1804 rectifies the input waveform, and its turn-on voltage sets the minimum voltage at which the optocoupler 1806 activates. Diode 1805 provides a reverse current path for negative going swings of the input voltage, helping to safeguard the optocoupler. The optocoupler 1806 converts the rectified input power signal to a pulse train whose pulse width is determined by the input voltage level, waveform frequency, and DC offset. Resistor 1807 provides the necessary voltage reference to the optocoupler open collector output. The low-pass filter 1808 converts the pulse train into an analog signal representative of the input power voltage level and sustained disturbance. This analog signal is compared to setpoints in the comparators 1809. Over-voltage and under-voltage detection signals are routed to the alarm circuit. The low pass filter and comparators can also be replaced with a microcontroller or microprocessor 1810, which counts the number of pulses to determine the input power voltage level and sustained disturbance.

Figure 19:
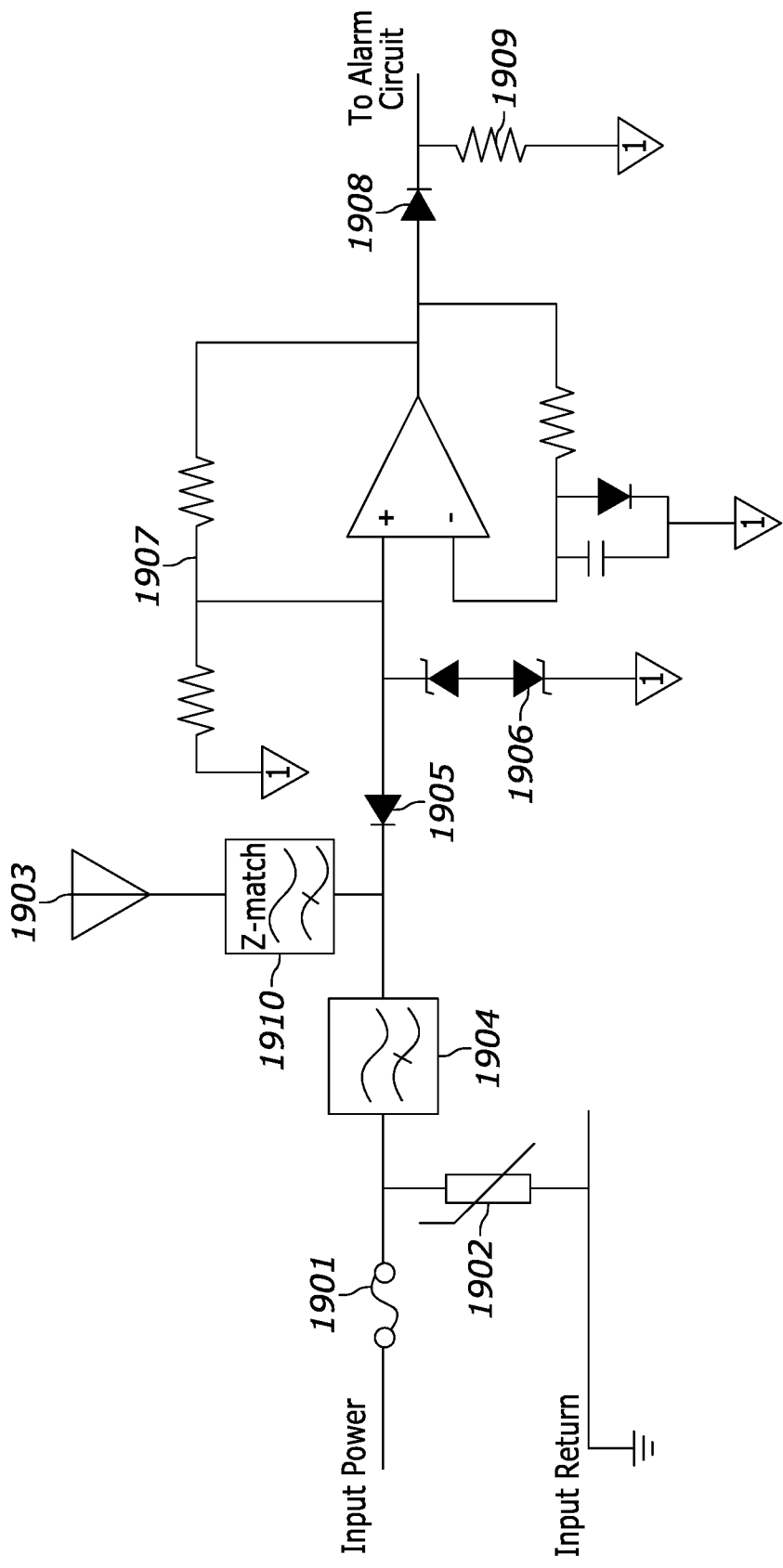
FIG. 19 illustrates a simplified schematic diagram of the transient disturbance detection circuit; this particular embodiment comprises a fuse, protective varistor, high-pass filter, impedance-matched filter, bidirectional transient voltage suppression diode, high-speed monostable multivibrator pulse detector, blocking diode, and pull-down bias resistor according to embodiments of the present inventions.

FIG. 19 illustrates a simplified schematic of the pulse detector 1505, which monitors the input power line and the ambient radiated environment for transient electromagnetic pulse disturbances associated with the E1 and E2 phases. The pulse detector 1505 detects transient electromagnetic pulse disturbances associated with E1 and E2 phases of at least one of an electromagnetic pulse and a solar storm. The pulse detector 1505 responds to pulse disturbance durations ranging from nanoseconds to microseconds. The input may be fused 1901 and protected from severe overvoltage conditions by transient protection device 1902. The combination of input power and conducted transient electromagnetic pulse disturbance are passed through a high-pass filter 1904. The high-pass filter passes pulse disturbance durations ranging from nanoseconds to microseconds. A minimum end of the nanoseconds to microseconds range could be chosen at about 10 nanoseconds or about 20 nanoseconds because EMP detonations were measured to have a minimum E1 duration of near 20 nanoseconds. The high-pass filter 1904 also removes unwanted frequencies, including the frequency of power transmission. An antenna 1903 also connects to the input power node through an impedance-matched filter 1910 to maximize the power transfer of the radiated transient electromagnetic pulse disturbance. The antenna 1903 has an electrical characteristic such as length tuned to a frequency spectrum of the transient electromagnetic pulse disturbances. A diode 1905 works in conjunction with the filters to act as a differentiator, turning either positive-to-negative or negative-to-positive signal edge transitions into a sharp transient impulse. A bidirectional transient protection device 1906 ensures that the impulse voltage levels do not exceed the op-amp's allowed input voltage range. The impulse is input to a very high-bandwidth op-amp configured as pulse detector as a monostable multivibrator 1907. The pulse detector is a two-state pulse-triggered detection circuit using edge, pulse, or impulse detection. An edge, pulse, or impulse at the pulse detector input causes its output to change state. The monostable multivibrator 1907 is one preferred embodiment of the pulse detector. Alternative embodiments can be peak detection devices, high-speed samplers, flip flops, high-gain comparators, and transient protection devices with very fast turn on times. In a preferred embodiment, the output of the multivibrator is an active-low pulse whose pulse width is set by the passive components of the multivibrator. A blocking diode 1908 is used to prevent the shared connections in the alarm circuit from affecting the multivibrator performance. A resistor 1909 provides biasing for the alarm circuit connection. The output is routed to the alarm circuit 1506.

Figure 20:
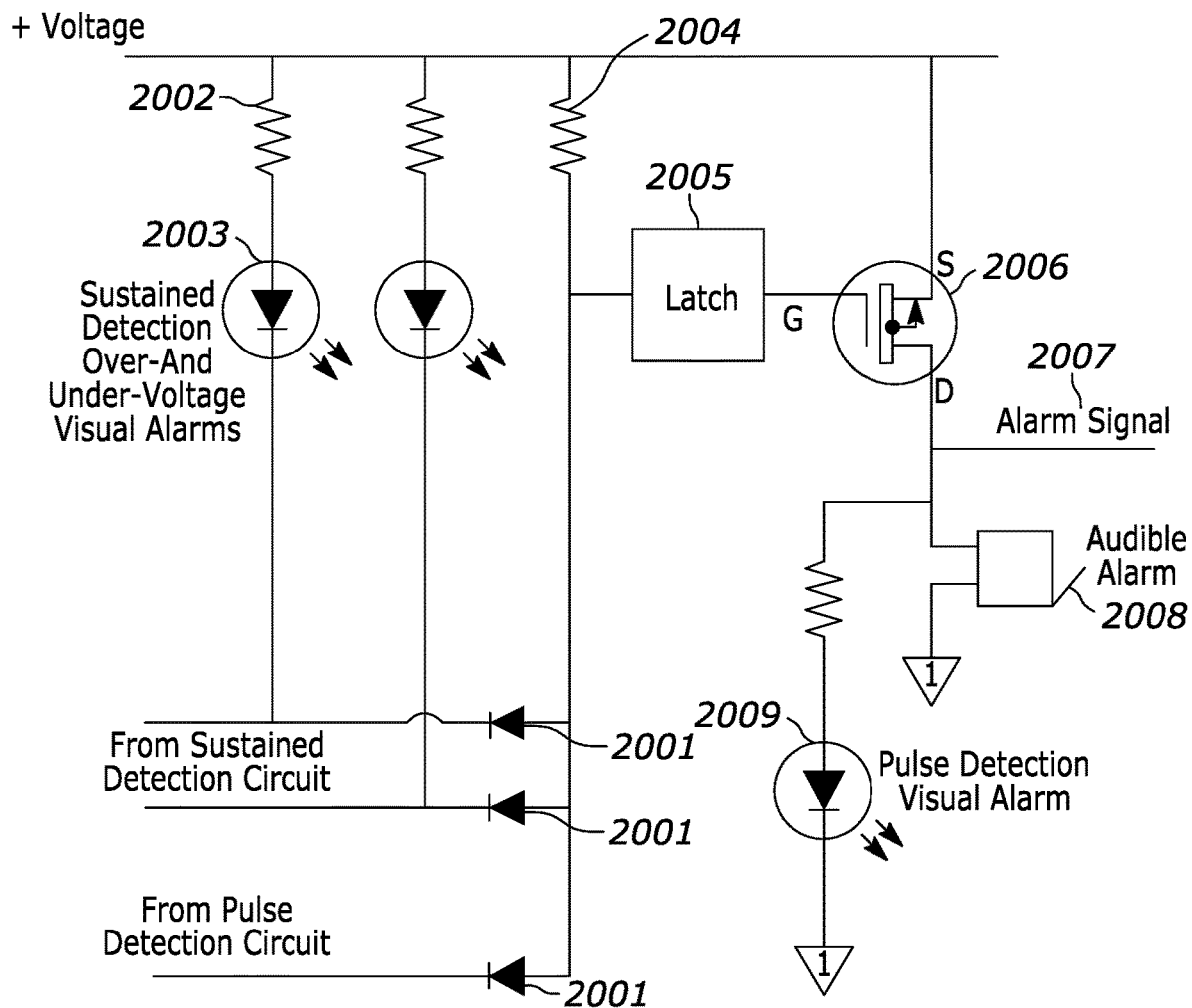
FIG. 20 illustrates a simplified schematic diagram of the alarm circuit; this particular embodiment comprises light-emitting diodes, wired- or connected diodes, a p-channel field effect transistor, an optional resettable latch, an audible alarm, and an output alarm signal according to embodiments of the present inventions.

FIG. 20 illustrates a simplified schematic of the alarm circuit 1506, which is fed by the sustained detection circuit 1504 and the pulse detection circuit 1505. Outputs of the sustained detection and pulse detection circuits are wire-OR'd together using diodes 2001. Current limiting resistors 2002 and light-emitting diodes 2003 provide a visual warning of sustained over-voltage, sustained under-voltage, and pulse disturbance conditions. Likewise, a light-emitting diode circuit 2009 provides a visual warning of pulse detection. Resistor 2004 along with resistor 1909 are used to set the bias point on the gate of the p-channel MOSFET 2006. The specific embodiment described in FIGS. 18 and 19 provide different alarms for sustained under voltage (a pulsing beep-beep-beep), sustained over voltage (a continuous beep), and pulse disturbance (a single controlled-duration beep). An inline latch 2005 can also be used to hold the state of the driving signal, if so desired. Such a latch would be either manually resettable or reset automatically with an internal timer, not shown. The p-channel MOSFET 2006 acts as a switch, providing power to the audible alarm 2008 when the sustained or pulse disturbance conditions are detected. Additionally, an alarm signal 2007 can be used as a trigger to disconnect power or redirect the flow of electrical power to an alternate path. The discrete indication signal can also be used to send a text or email or TCP/IP signal or couple to a Bluetooth or WiFi or cellular radio or 5G internet of things transceiver to transmit an alarm, in various alternate embodiments.

Figure 21:
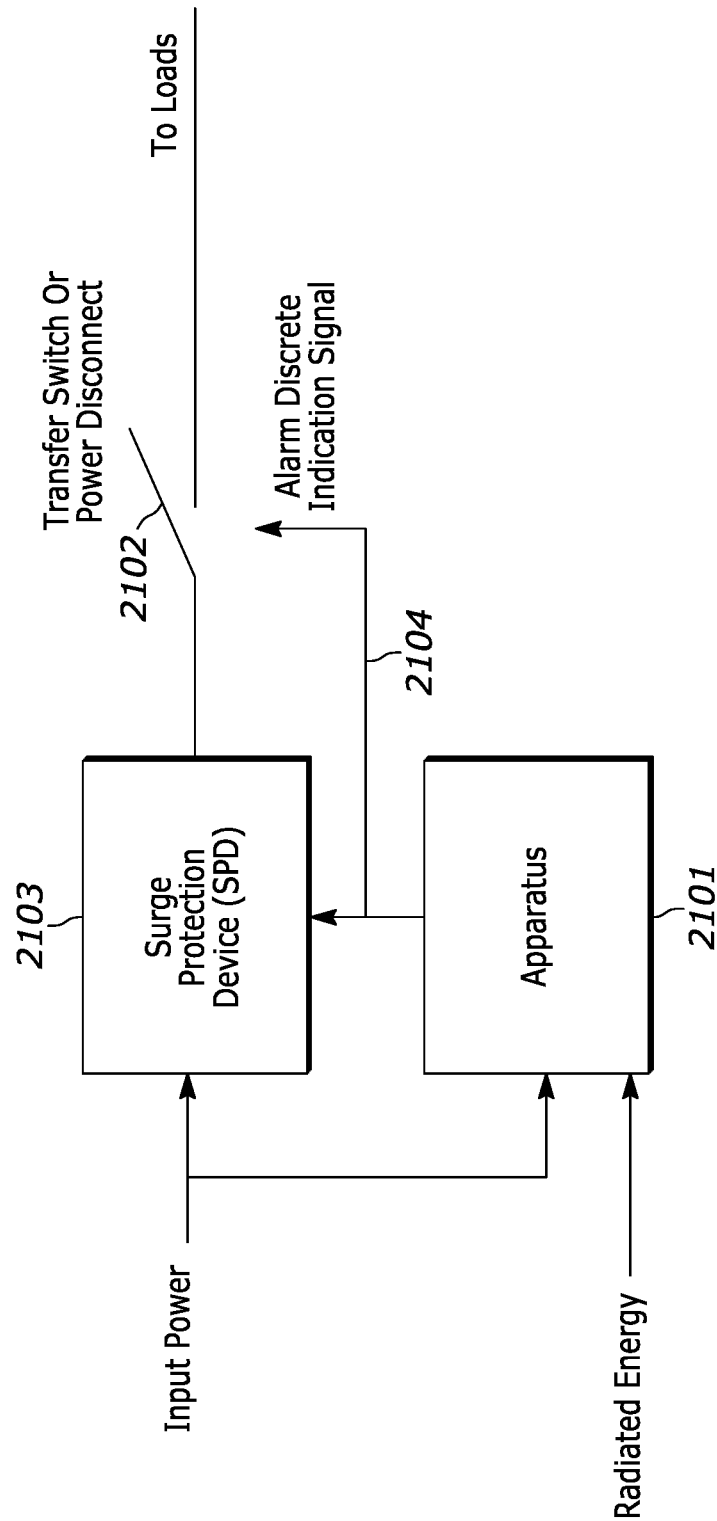
FIG. 21 illustrates a block diagram of the alarm signal generated by the pulse detector and sustained level detector used to disconnect electrical power or redirect the flow of electrical power to an alternate path according to embodiments of the present inventions.

FIG. 21 illustrates a simplified block diagram of the apparatus 2101 being used to monitor the input power line of a surge protection device (SPD). In the event of a sustained level disturbance or transient electromagnetic pulse disturbance associated with an EMP or solar storm, the apparatus's internal alarm circuit will activate a visual indicator and an audible indicator. It can also send a discrete indication signal 2104 to an upstream or downstream power disconnect or transfer switch, interrupting or rerouting of the flow of electrical power. In this embodiment, the apparatus 2101 could draw its power either from a self-contained energy storage device, such as a battery, from the power line that it is monitoring, or from some external tertiary power source.

Figure 22:
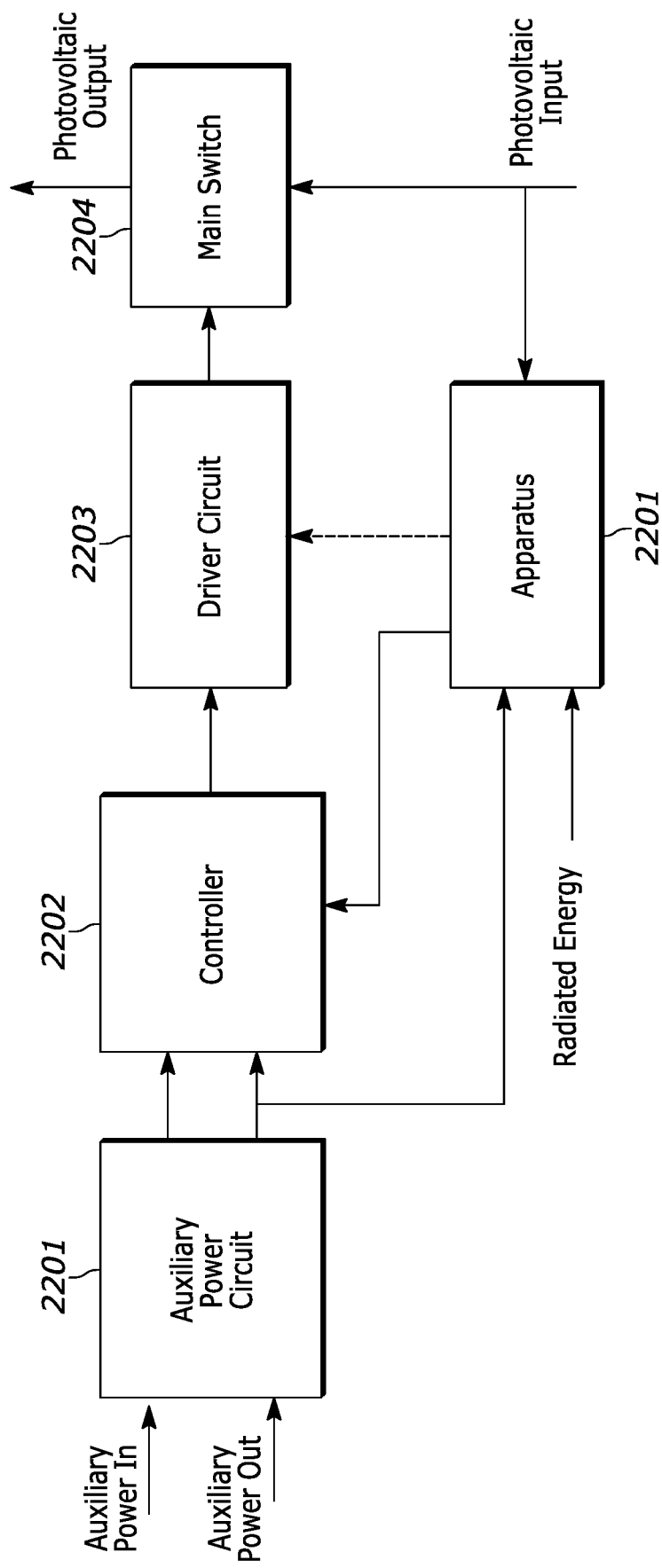
FIG. 22 illustrates a block diagram of an embodiment being incorporated into a safety cutoff switch of a solar power generation system; in this embodiment, the sustained level detector and pulse detector circuits monitor the photovoltaic power and auxiliary power lines for disturbances indicative of an EMP or solar storm; if such an event is detected, the detectors send an alarm to the controller or the driver circuit to force the disconnection of photovoltaic power.

FIG. 22 illustrates a block diagram of the apparatus 2101 being incorporated into a safety cutoff switch of a solar power generation system. Auxiliary input power is fed to an auxiliary power circuit 2201 whose primary purpose is to recondition the power to appropriate levels for the controller 2202, and monitor the health and status of the module, including temperature and input voltage levels. If the voltage falls out of a predefined specified range, or if the temperature becomes too high, the controller 2202 signals the driver circuit 2203 to open the main photovoltaic power switch 2204. The apparatus 2101 monitors the auxiliary input power, photovoltaic input power, and the ambient environment. If a sustained level disturbance or pulse disturbance that matches the characteristics of an EMP or solar storm is detected, an alarm discrete indication signal is sent to the controller circuit 2202 to force the driver circuit 2203 to open the main switch, disconnecting photovoltaic power. An alternative embodiment is to have the apparatus 2101 send the alarm discrete indication signal directly to the driver circuit 2203 to trigger the opening of the main photovoltaic power switch 2204. In this embodiment, the apparatus 2101 could draw its power either from a self-contained energy storage device, such as a battery, or from the auxiliary power input, the photovoltaic input, or some external tertiary power source.

Figure 23:
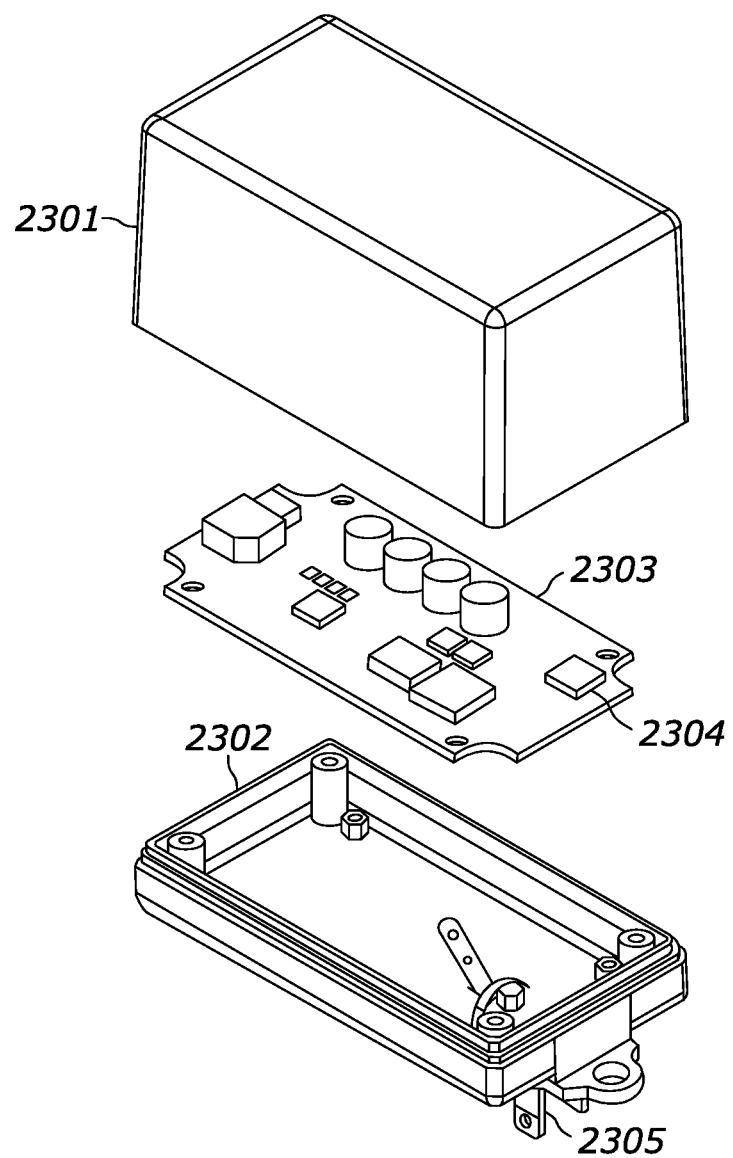
FIG. 23 illustrates a conceptual drawing of a plug-in module housing an embodiment according to embodiments of the present inventions.

FIG. 23 illustrates an embodiment of a plug-in module housing an embodiment. For purposes of protecting the contained electronics, the top 2301 and bottom 2302 of the housing may be layered with a conductive shielding material to reduce the radiated energy coupling into the circuits. Circuitry is constructed on a printed circuit board assembly 2303 and mounted to the housing. The antenna 2304 could be an onboard component or mounted either internal or external to the housing 2301 and 2302. The alternating current (AC) wall plug 2305 is shown on the underside of the bottom housing 2302. Similarly, an alternative embodiment could draw direct current (DC) power from the auxiliary receptacle of a vehicle rather than from an AC wall outlet.

Figure 24:
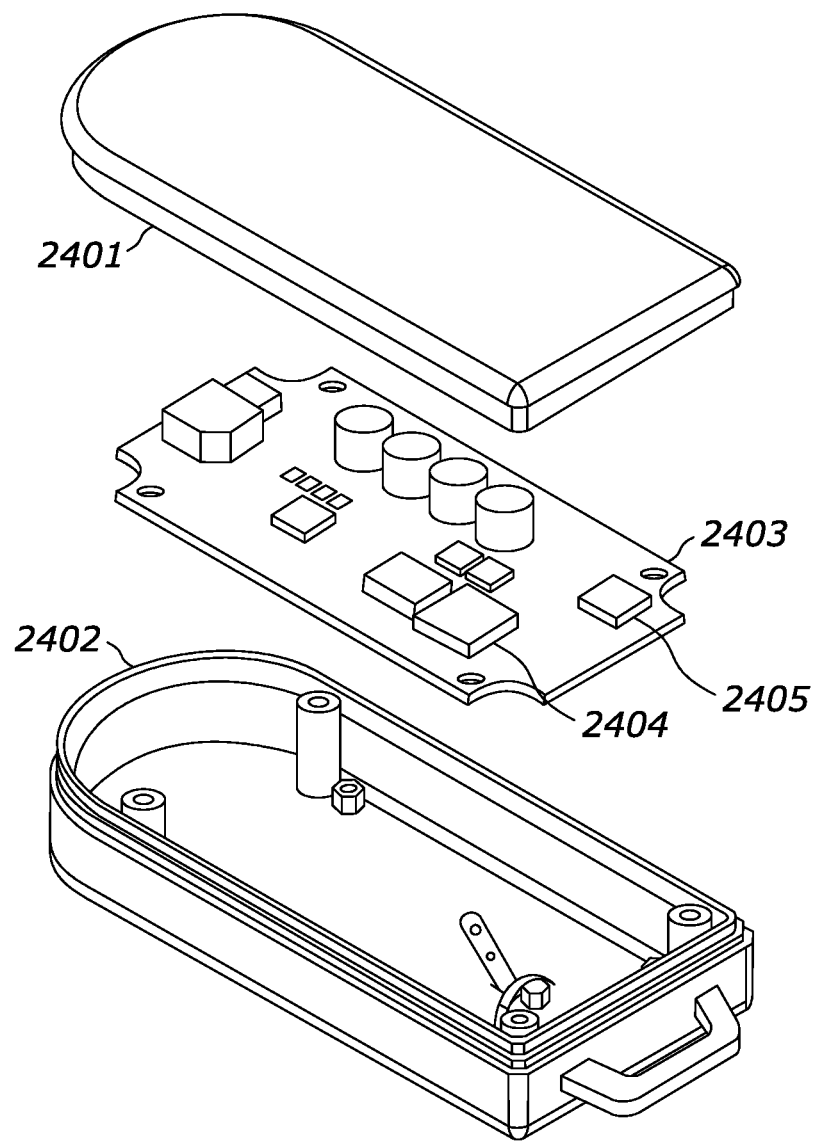
FIG. 24 illustrates a conceptual drawing of a battery-powered key fob module housing an embodiment according to embodiments of the present inventions.

FIG. 24 illustrates an embodiment of a battery-operated key fob module housing an embodiment. For purposes of protecting the contained electronics, the top 2401 and bottom 2402 of the housing may be layered with a conductive shielding material to reduce the radiated energy coupling into the circuits. Circuitry is constructed on a printed circuit board assembly 2403 and mounted to the housing. The antenna 2405 could be an onboard component or mounted either internal or external to the housing 2401, 2402. A battery or other energy storage device, 2404, would also be included, along with energy management hardware to maximize usable life.

Figure 25:
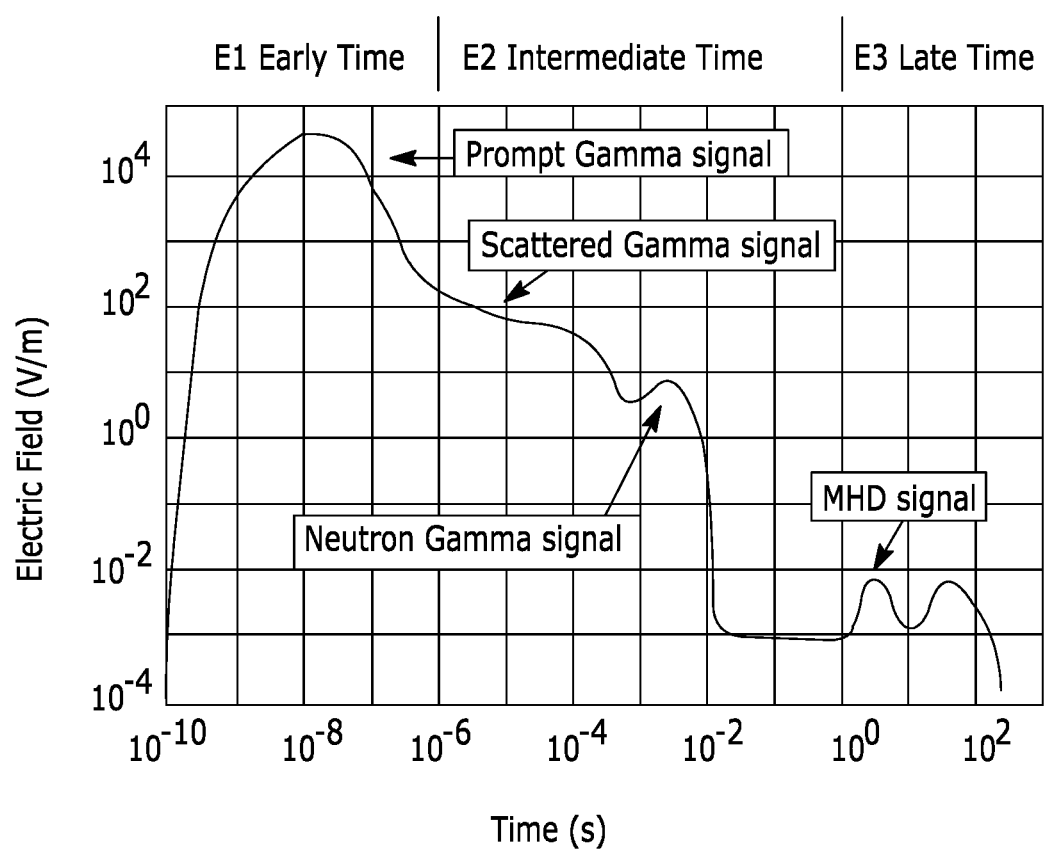
FIG. 25 illustrates a plot showing characteristics of a high-altitude nuclear-generated electromagnetic pulse (EMP) waveform over time.

FIG. 25 illustrates a plot showing characteristics of a high-altitude nuclear-generated electromagnetic pulse (EMP) waveform over time. An EMP results in a complex transient disturbance with three distinct phases, identified as E1, E2, and E3. The waveform of the early time E1 phase has a rise time of approximately 3 ns and a pulse width of approximately 20 ns. It is followed by the intermediate time waveform component of phase E2, which has a pulse width on the order of microseconds. Finally, the late time waveform of phase E3, might last from seconds to hours in duration. Similarly, the waveform resulting from a solar storm is comparable to the E3 of an EMP, with a duration lasting from seconds to hours.

As shown in FIG. 25, nuclear-generated EMP is described as comprising three distinct phases: the early time event, E1, the intermediate time event, E2, and the late time event, E3. During E1, the electromagnetic disturbance is an extremely brief, broad-band pulse lasting nanoseconds to hundreds of nanoseconds with amplitudes reaching tens of thousands of volts per meter, making it capable of disrupting a wide array of electronic systems. During E2, the electromagnetic disturbance is comparable in duration to lightning, lasting microseconds, and with amplitudes of exceeding one hundred volts per meter, lending itself to coupling most efficiently onto medium and long conductors. During E3, the electromagnetic disturbance is a sustained pulse, lasting seconds to hours that, while low in amplitude, can introduce damaging currents onto very long conductors, such as those of the power grid. A solar storm can also result in an electromagnetic disturbance felt at the Earth's surface similar to the E3 component of an EMP, with the disturbance lasting from seconds to hours and coupling most efficiently into very long conductors.

The present inventions are particularly useful in the detection of a solar storm or EMP. Solar storms and EMPs both result in potentially damaging E3 electrical disturbances in infrastructures with long conductors, such as large-scale power distribution and telecommunications systems. These sustained disturbances propagate along the conductors to affect interconnected electronics, including those in supervisory control and data acquisition (SCADA) systems, computers, transceivers, and other sensitive electronic hardware. The present inventions specifically monitor the input power lines for sustained electrical disturbances indicative of an EMP or solar storm with durations from seconds to hours.

EMPs also generate powerful E1 and E2 electromagnetic pulse disturbances that propagate along conductors and through the air to couple directly into both large-scale and small-scale electronic assemblies, including but not limited to computers, microcontrollers, vehicles, radio systems, home appliances, and cellular telephones. The present inventions monitor the input power lines and the ambient environment for E1 and E2 electromagnetic pulse disturbances with durations ranging from nanoseconds to microseconds.

FIG. 26 summarizes the waveform components resulting from an EMP. The E1 component has a duration of nanoseconds and is capable of coupling into both small-scale and large-scale electronics through radiated and conducted means. The E2 component has a duration of microseconds and is capable of coupling into both small- and large-scale electronics through radiated and conducted means. The E3 component has a duration ranging from seconds to hours and couples into large-scale infrastructures, such as the power grid, by induction, and is then distributed to both large and small systems through conduction.

Figure 27:
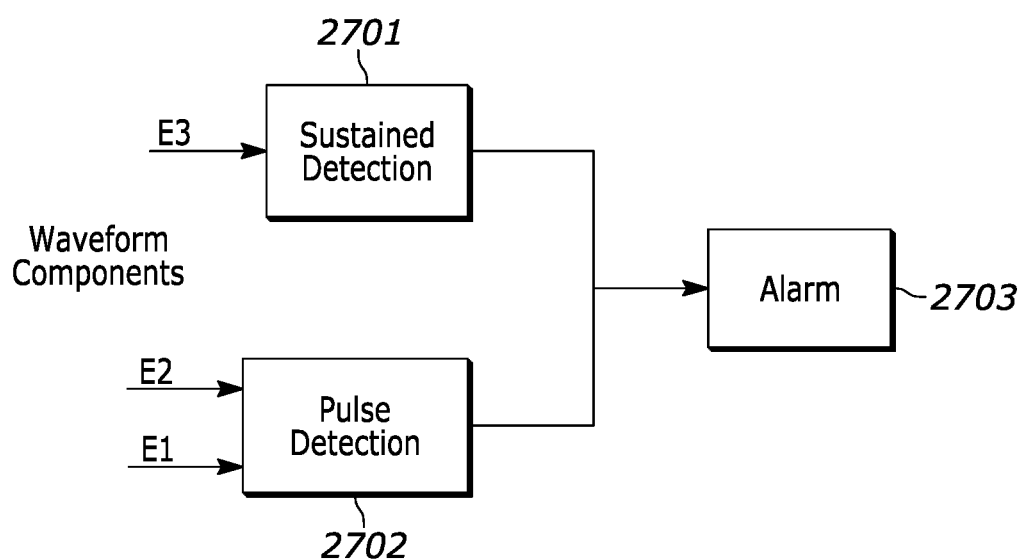
FIG. 27 summarizes how the three waveform components associated with the E1, E2, and E3 phases of an EMP are detected by the apparatus's detection circuitry.

FIG. 27 illustrates how the sustained detection circuit and pulse detection circuit are used to detect the various waveform components associated with the different phases of an EMP or solar storm. The sustained disturbance detection circuit 2701 detects waveforms associated with the E3 phase of an EMP, as well as the E3 waveform resulting from a solar storm or other long-duration electrical disturbance. The pulse detection circuit 2702 detects transient electromagnetic pulse disturbances associated with E1 and E2 phases. Once detected, an alarm is activated that provides a visual indicator, audible indicator, and a discrete indication signal.

In summary, the present inventions detect complex, time-variant conducted and radiated disturbances associated with an EMP or solar storm. The present inventions provide visual and audible warnings, as well as a discrete indication signal that can be used to disconnect or redirect the flow of electricity. The detection of an EMP or solar storm would provide early warning of potentially damaging events, allowing protective actions to be taken.

Examples of Intended Uses

The present inventions can be used to monitor the voltage levels of electrical power lines feeding a home, business, military structure, trailer, recreational vehicle, boat, automobile, or other electrical-powered structure, system, or device. When voltage levels on the power lines move outside of acceptable predetermined voltage levels (i.e., normal operating range), the sustained level detection circuit warns the user with visual alarms, audible alarms, and a discrete indication signal that can be used to drive or trigger power disconnect circuitry. Additionally, the pulse detection circuit monitors both the incoming power lines and the ambient environment for transient electromagnetic pulse disturbances associated with E1 and E2 phases of an EMP or solar storm.

The present inventions are designed with numerous built-in protections, including shielding and transient surge protection devices to ensure device survival during the EMP or solar storm disturbance events. Additionally, they are designed to operate at very high or low voltage levels, ensuring that the device continues to operate through the disturbance.

The present inventions provide a unique, robust method of providing early warning of an EMP or solar storm, enabling the user the opportunity to take appropriate protective actions. Such actions might include opening the main breaker on their home or business, unplugging critical or susceptible electrical devices, disconnecting the antennas from a radio system, preparing to evacuate the area, or warning others of the event. Additionally, embodiments could be incorporated into an automated power switching system, such as an automatic breaker or transfer switch, to automatically disconnect or reroute power when EMP or solar storm disturbances are detected. Likewise, embodiments could be used to drive an electromechanical actuator or mechanism to physically trip the power disconnect (e.g., main breaker) in the event of a potentially harmful disturbance. Additionally, they could be incorporated into a solar power generation system safety cutoff switch, providing another input condition under which the cutoff switch disconnects power coming from the photovoltaic array. Finally, it could be added to a surge protection device (SPD) to provide visual warning, audible warning, or an indication signal used to interrupt the flow of electricity.

Any letter designations such as (a) or (b) etc. used to label steps of any of the method claims herein are step headers applied for reading convenience and are not to be used in interpreting an order or process sequence of claimed method steps. Any method claims that recite a particular order or process sequence will do so using the words of their text, not the letter designations.

Unless stated otherwise, terms such as "first" and "second" are used to arbitrarily distinguish between the elements such terms describe. Thus, these terms are not necessarily intended to indicate temporal or other prioritization of such elements.

Any trademarks listed herein are the property of their respective owners, and reference herein to such trademarks is generally intended to indicate the source of a particular product or service.

Although the inventions have been described and illustrated in the above description and drawings, it is understood that this description is by example only, and that numerous changes and modifications can be made by those skilled in the art without departing from the true spirit and scope of the inventions. Although the examples in the drawings depict only example constructions and embodiments, alternate embodiments are available given the teachings of the present patent disclosure.

What is claimed is:

1. An apparatus configured to detect an E3 phase and E1 and E2 phases of an electromagnetic pulse and at least generate an alarm, the apparatus comprising:
   a pulse detector connected to an input, the pulse detector configured to detect transient electromagnetic pulse disturbances associated with at least one of E1 and E2 phases of an electromagnetic pulse by responding to pulse disturbance durations ranging from nanoseconds to microseconds;
   a mains utility power supply line;
   a sustained level detector connected to the mains utility power supply line, the sustained level detector configured to detect a sustained voltage level associated with an E3 phase of at least one of an electromagnetic pulse and a solar storm;
   a delay timer operatively coupled to the pulse detector for holding an indication of a transient electromagnetic pulse disturbance for a predetermined time limit of minutes;
   a latch operatively coupled to the sustained level detector and the delay timer to indicate an electromagnetic pulse has occurred when the sustained electrical disturbance occurs following the transient electromagnetic pulse disturbance within the predetermined time limit; and
   an alarm operatively coupled to the latch for alerting when the electromagnetic pulse is indicated by the latch.

2. An apparatus according to claim 1, wherein the delay timer holds an indication of the transient electromagnetic pulse disturbance for a predetermined time limit of about 10 minutes.

3. An apparatus according to claim 2, wherein the pulse detector is configured to detect pulse disturbance durations in nanoseconds for the E1 phase of an electromagnetic pulse.

4. An apparatus according to claim 2, wherein the pulse detector is configured to detect pulse disturbance durations in microseconds for the E2 phase of an electromagnetic pulse.

5. An apparatus according to claim 2, wherein the apparatus including the pulse detector, the sustained level detector, the delay timer, and the latch is contained in an unshielded housing.

6. An apparatus according to claim 2, wherein the apparatus including the pulse detector, the sustained level detector, the delay timer, and the latch is contained in a housing and further comprises at least a pair of AC mains wall plug prongs extending from a side of the housing and operatively coupled to the mains utility power supply line.

7. An apparatus according to claim 1, further comprising a reserve power source; and
a power select switch having an input operatively coupled to the a mains utility power supply line and the reserve power source and having an output operatively coupled to switch power to the pulse detector, the sustained level detector, the delay timer, the latch, and the alarm from the mains utility power supply line to the reserve power source when the latch indicates the electromagnetic pulse has occurred when the sustained electrical disturbance occurs following the transient electromagnetic pulse disturbance within the predetermined time limit.

8. An apparatus according to claim 1, further comprising an antenna connected to the input of the pulse detector to receive the input signal, the antenna having an electrical characteristics tuned to a frequency spectrum of the transient electromagnetic pulse disturbances associated with at least one of E1 and E2 phases of an electromagnetic pulse.

9. An apparatus according to claim 1, wherein the pulse detector comprises a filter connected to the input and having a passband time constant of about 100 milliseconds that removes frequencies associated with the power supply line.

10. An apparatus according to claim 1, wherein the input to the pulse detector is operatively coupled to the mains utility power supply line.

11. An apparatus according to claim 1, wherein the latch is operatively coupled to the sustained level detector and the delay timer to indicate an electromagnetic pulse has occurred when both the sustained electrical disturbance and the transient electromagnetic pulse disturbance occur within the predetermined time limit and the sustained electrical disturbance occurs after the transient electromagnetic pulse disturbance.

12. An apparatus according to claim 1, further comprising a mechanical actuator operatively coupled to the latch and the mains utility power supply line to cause disconnection of the mains utility power supply line from utility power when the electromagnetic pulse is indicated by the latch.

13. An apparatus according to claim 12, wherein the mechanical actuator comprises a crowbar circuit connected across the mains utility power supply line after a circuit breaker to trip and open the circuit breaker and interrupt the mains utility power supply.

14. An apparatus according to claim 12, wherein the mechanical actuator is a switch to disconnect the mains utility power when the electromagnetic pulse is indicated by the latch.

15. An apparatus according to claim 12, wherein the mechanical actuator is secured to a circuit breaker box to mechanically move a circuit breaker to disconnect the mains utility power supply.

16. An apparatus according to claim 15, wherein the mechanical actuator comprises an electromechanically activated mechanism securely mounted to a panel front face of a circuit breaker box with an end effector in a configuration to push open a switch surface of a circuit breaker switch lever.

17. An apparatus according to claim 16, wherein the electromechanically activated mechanism comprises a linear actuator.

18. An apparatus according to claim 16, wherein the electromechanically activated mechanism comprises a solenoid and spring configured to release the solenoid.

19. An apparatus according to claim 16, wherein the electromechanically activated mechanism comprises an electromagnetic actuator comprising an electromagnet and a spring.

20. An apparatus according to claim 12,
wherein to the apparatus further comprises a reserve power source; and
wherein the mechanical actuator is operatively connected to the a reserve power source to operate the mechanical actuator using power from the reserve power source.

21. An apparatus according to claim 20, wherein to the apparatus further comprises
a power select switch having an input operatively coupled to the a mains utility power supply line and the reserve power source and operatively coupled to switch power to the pulse detector, the sustained level detector, the delay timer, the latch, the alarm, and the mechanical actuator from the mains utility power supply line from the mains utility power supply line to the reserve power source when the latch indicates the electromagnetic pulse has occurred when the sustained electrical disturbance occurs following the transient electromagnetic pulse disturbance within the predetermined time limit.

22. An apparatus according to claim 1, wherein the alarm comprises an indicator chosen from the group consisting of a visual indicator, an audible indicator, and a discrete indication signal.

23. An apparatus according to claim 1,
wherein the alarm comprises a first indicator operatively coupled to the latch for alerting when the electromagnetic pulse is indicated by the latch.

24. An apparatus according to claim 23,
wherein the alarm further comprises a second indicator and a third indicator,
wherein the second indicator indicates a transient electromagnetic pulse disturbance detected by the pulse detector, and the third indicator indicates a sustained electrical disturbance detected by the sustained level detector; and
wherein the first indicator and the second indicator and the third indicator are each chosen from the group consisting of a visual indicator, an audible indicator, and a discrete indication signal.

25. An apparatus according to claim 1, wherein the pulse detector, the sustained level detector, the delay timer, and the latch and the alarm each consists of discrete analog components for hardening to survive electromagnetic disturbances associated with an electromagnetic pulse or a solar storm.

\* \* \* \* \*